(12) United States Patent
    Imai

(10) Patent No.: US 10,942,432 B2
(45) Date of Patent: Mar. 9, 2021

(54) LIGHT EMITTING APPARATUS AND PROJECTOR

(71) Applicant: SEIKO EPSON CORPORATION, Tokyo (JP)

(72) Inventor: Yasutaka Imai, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/618,203

(22) PCT Filed: May 22, 2018

(86) PCT No.: PCT/JP2018/019636
§ 371 (c)(1),
(2) Date: Nov. 29, 2019

(87) PCT Pub. No.: WO2018/221316
PCT Pub. Date: Dec. 6, 2018

(65) Prior Publication Data
US 2020/0292928 A1     Sep. 17, 2020

(30) Foreign Application Priority Data
May 31, 2017   (JP) .................................. 2017-108388

(51) Int. Cl.
    G03B 21/20        (2006.01)
(52) U.S. Cl.
    CPC ......... *G03B 21/204* (2013.01); *G03B 21/208* (2013.01); *G03B 21/2066* (2013.01)
(58) Field of Classification Search
    CPC . G03B 21/204; G03B 21/208; G03B 21/2066

USPC .......................................................... 362/84
See application file for complete search history.

(56) References Cited

U.S. PATENT DOCUMENTS

| | | | |
|---|---|---|---|
| 2003/0062481 A1* | 4/2003 | Okada | G01T 1/202 |
| | | | 250/361 R |
| 2006/0076878 A1 | 4/2006 | Saito | |
| 2010/0328625 A1 | 12/2010 | Miyazaki et al. | |
| 2012/0200218 A1* | 8/2012 | Maemura | F21S 41/125 |
| | | | 313/483 |
| 2013/0221393 A1 | 8/2013 | Mao et al. | |
| 2013/0257264 A1 | 10/2013 | Tamaki et al. | |
| 2016/0040857 A1* | 2/2016 | Inoue | F21V 9/32 |
| | | | 362/343 |

FOREIGN PATENT DOCUMENTS

| | | |
|---|---|---|
| CN | 103222076 A | 7/2013 |
| JP | 2003-20476 A | 1/2003 |
| JP | 2006-179658 A | 7/2006 |

(Continued)

OTHER PUBLICATIONS

Aug. 28, 2018 International Search Report issued in International Patent Application No. PCT/JP2018/019636.

*Primary Examiner* — Ali Alavi
(74) *Attorney, Agent, or Firm* — Oliff PLC

(57) ABSTRACT

A light emitting apparatus including a base, a light source, and a plurality of columnar sections that are provided at the base and each include a first phosphor that emits light when irradiated with light emitted from the light source, in which the light source radiates the light to the columnar sections obliquely with respect thereto.

11 Claims, 15 Drawing Sheets

(56) References Cited

FOREIGN PATENT DOCUMENTS

| | | |
|---|---|---|
| JP | 2008-169060 A | 7/2008 |
| JP | 2008-218477 A | 9/2008 |
| JP | 2011-100163 A | 5/2011 |
| JP | 2012-162600 A | 8/2012 |
| JP | 5008631 B2 | 8/2012 |
| JP | 2013-203822 A | 10/2013 |
| WO | 2013/103039 A1 | 7/2013 |
| WO | 2014/123145 A1 | 8/2014 |

* cited by examiner

[Fig. 1]
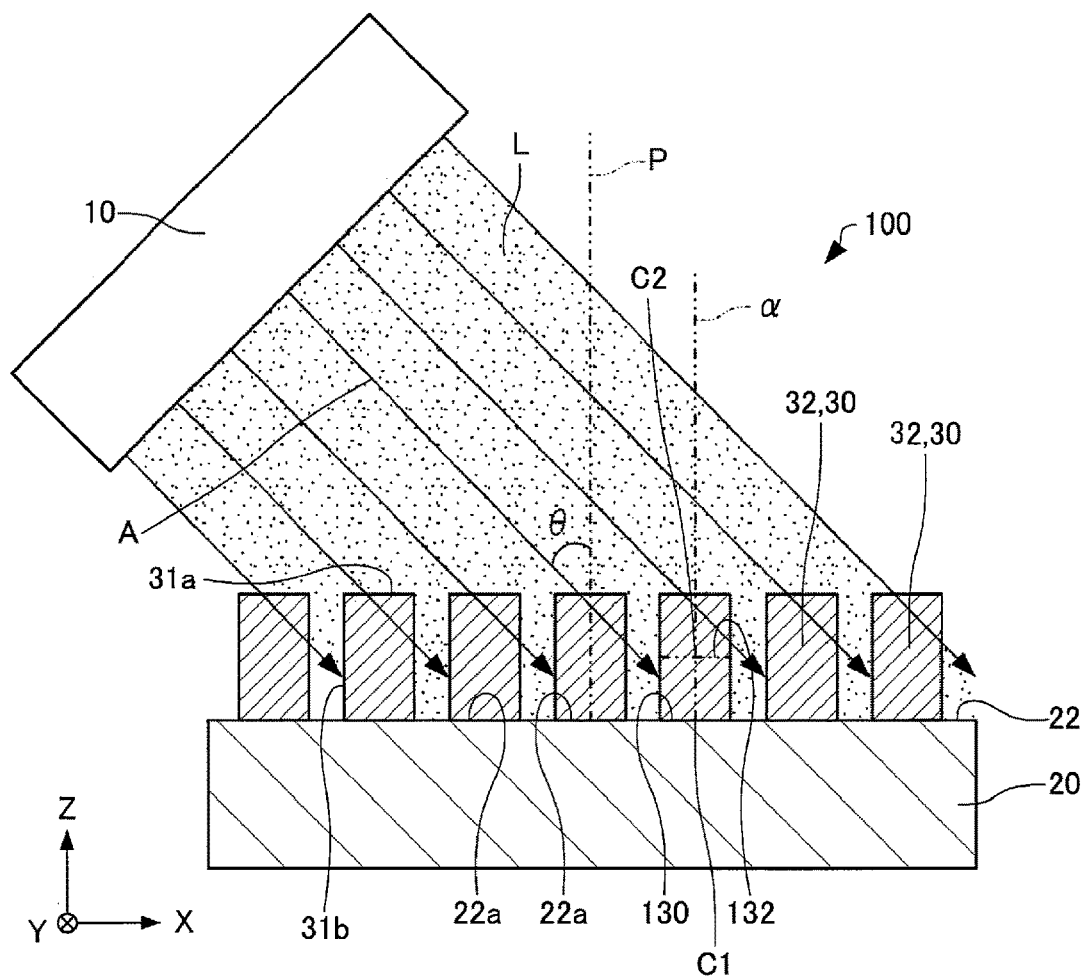
[Fig. 2]
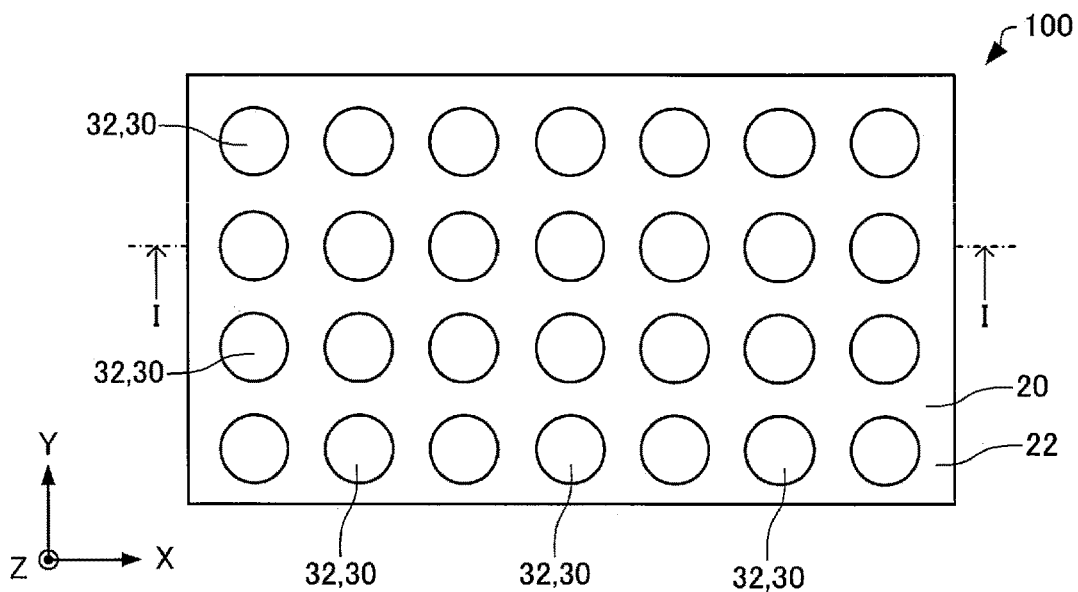

[Fig. 3]
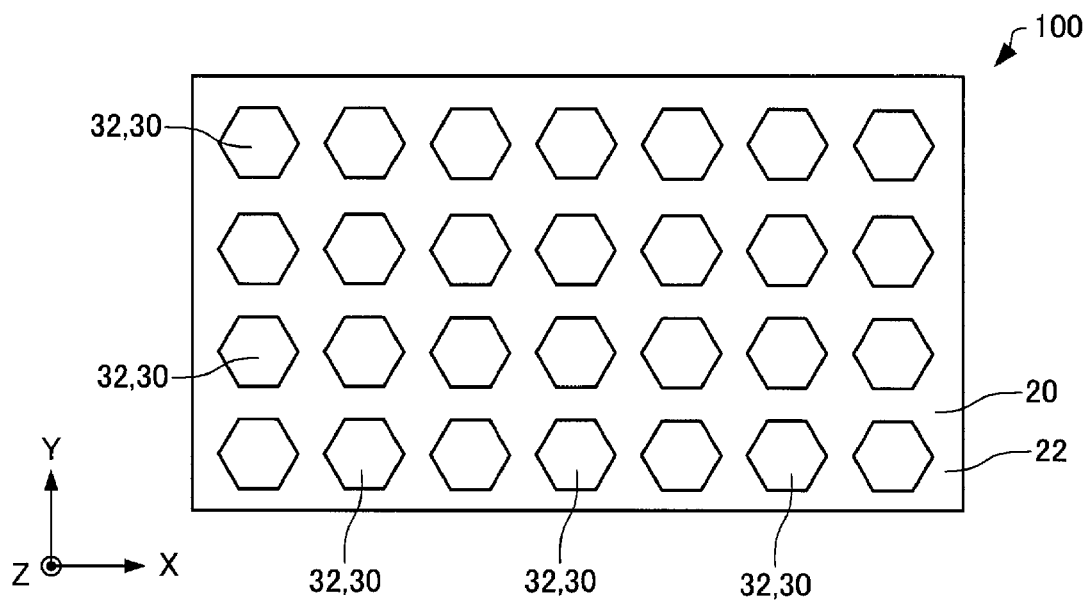
[Fig. 4]
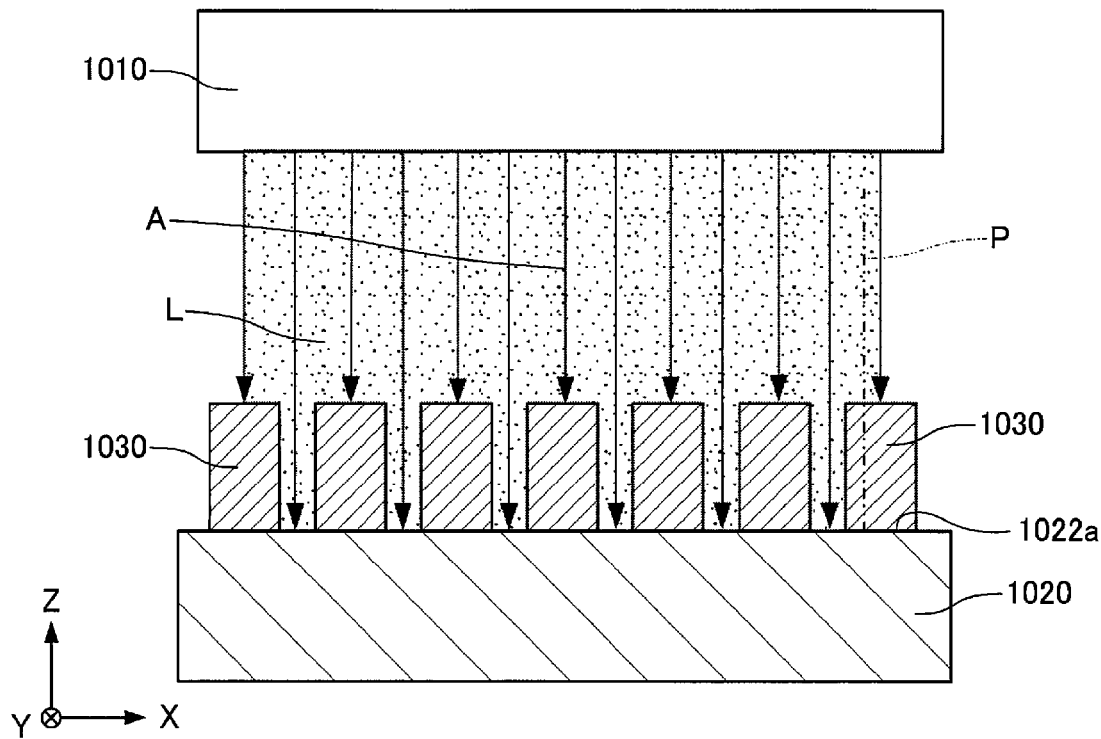

[Fig. 5]
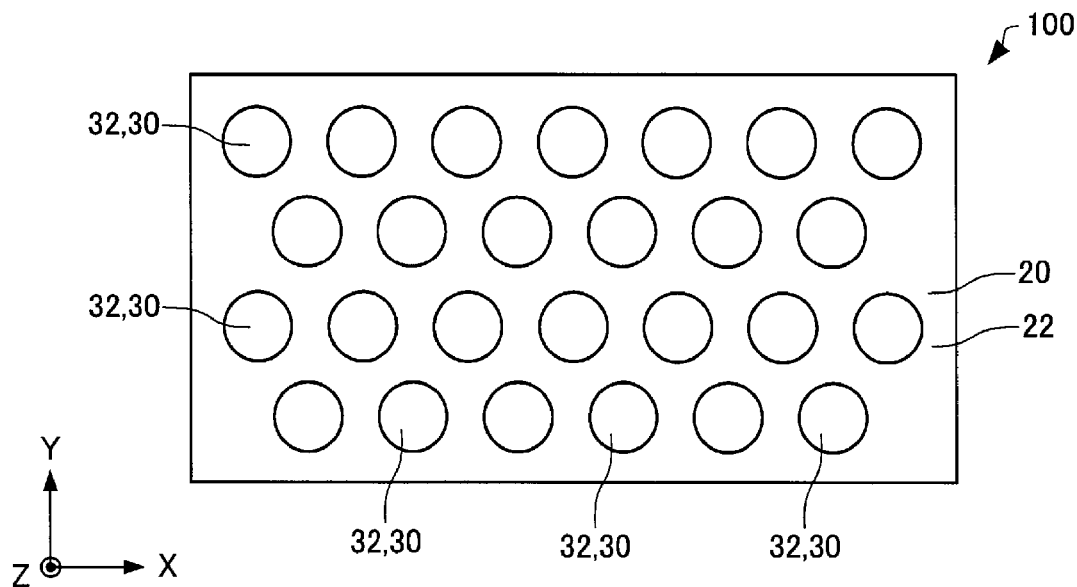
[Fig. 6]
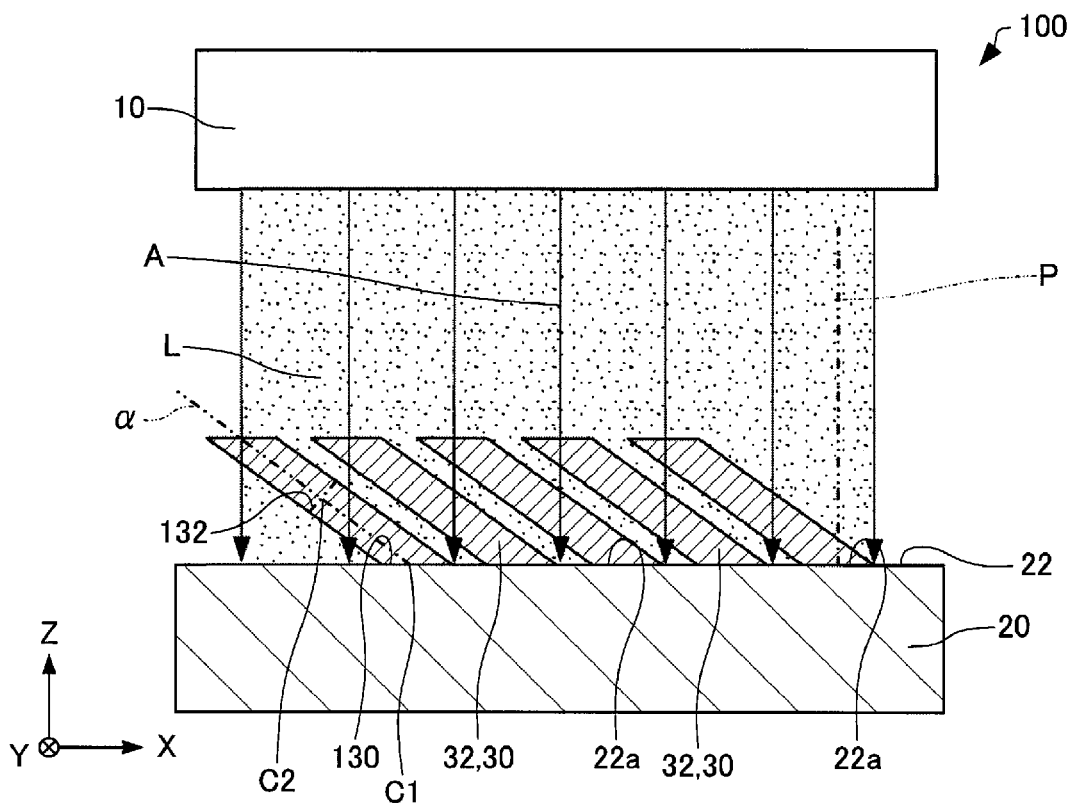

[Fig. 7]
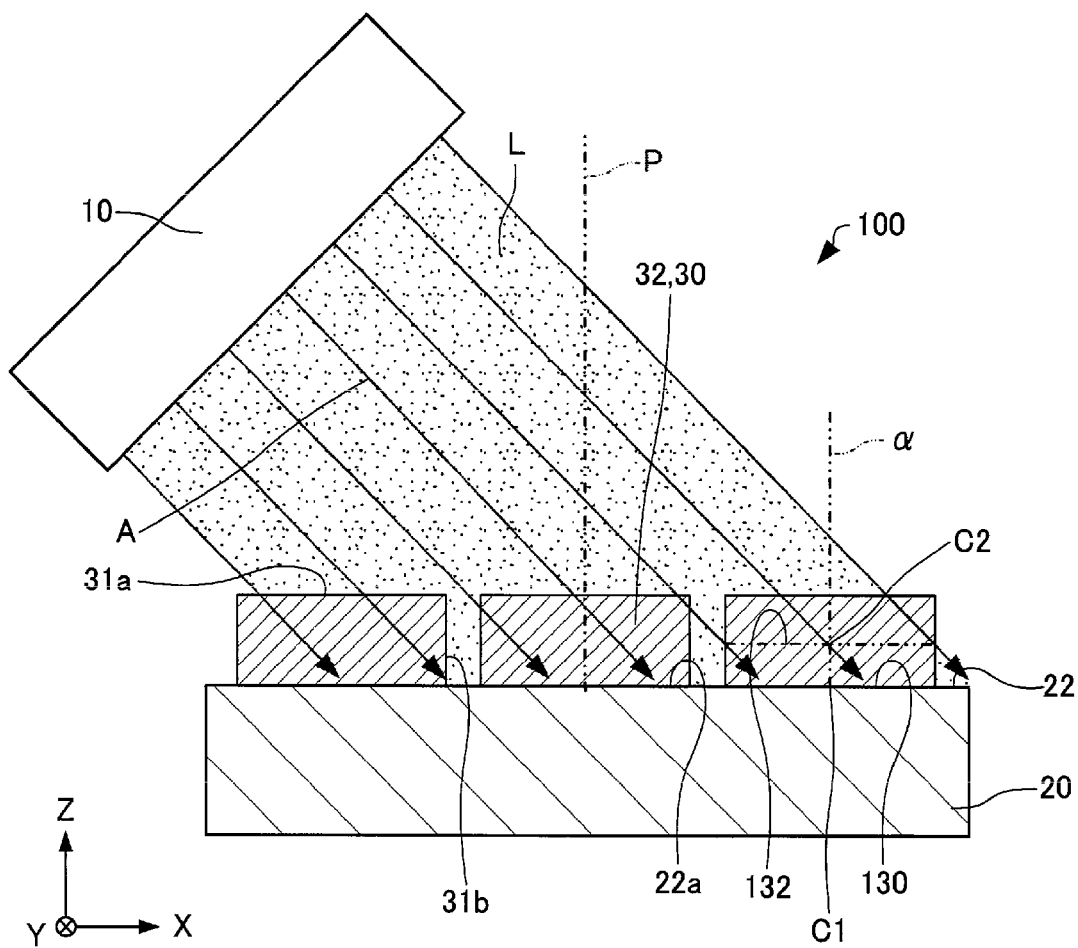

[Fig. 8]
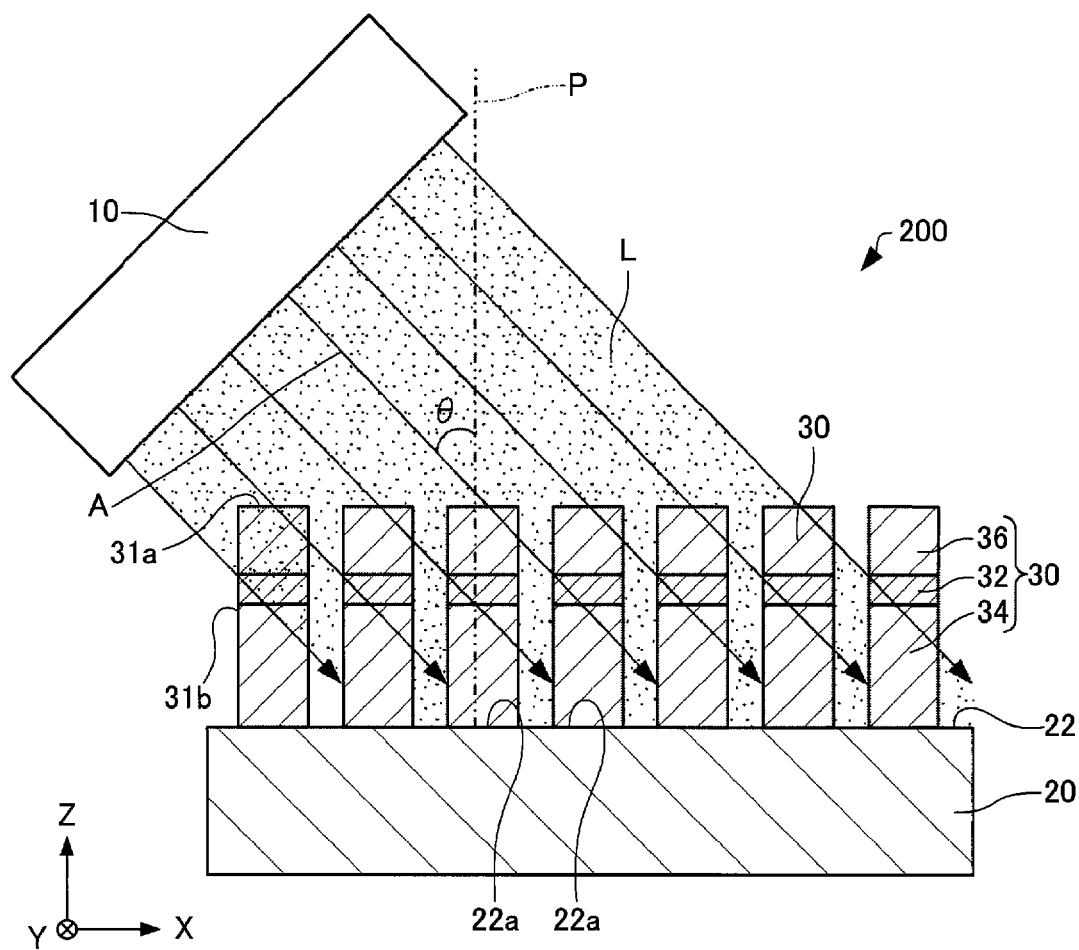

[Fig. 9]
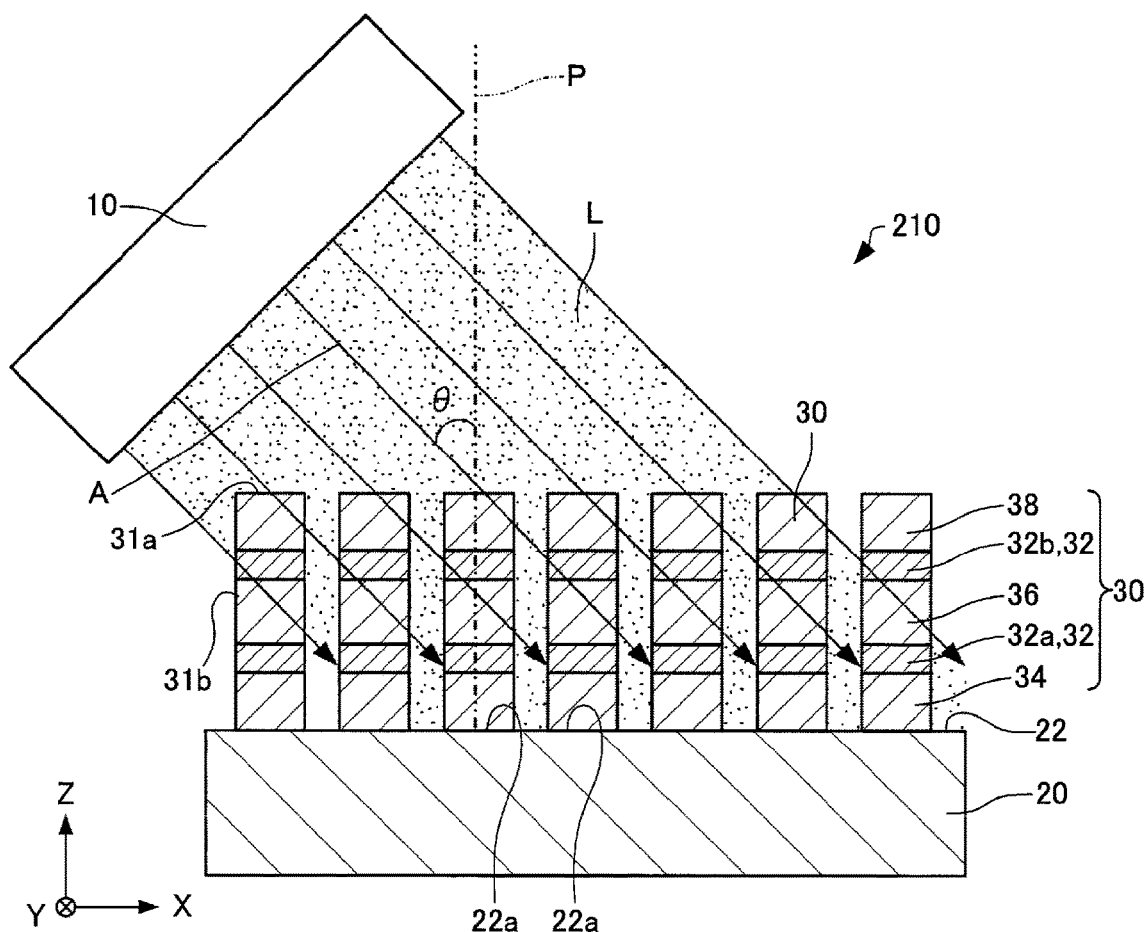

[Fig. 10]
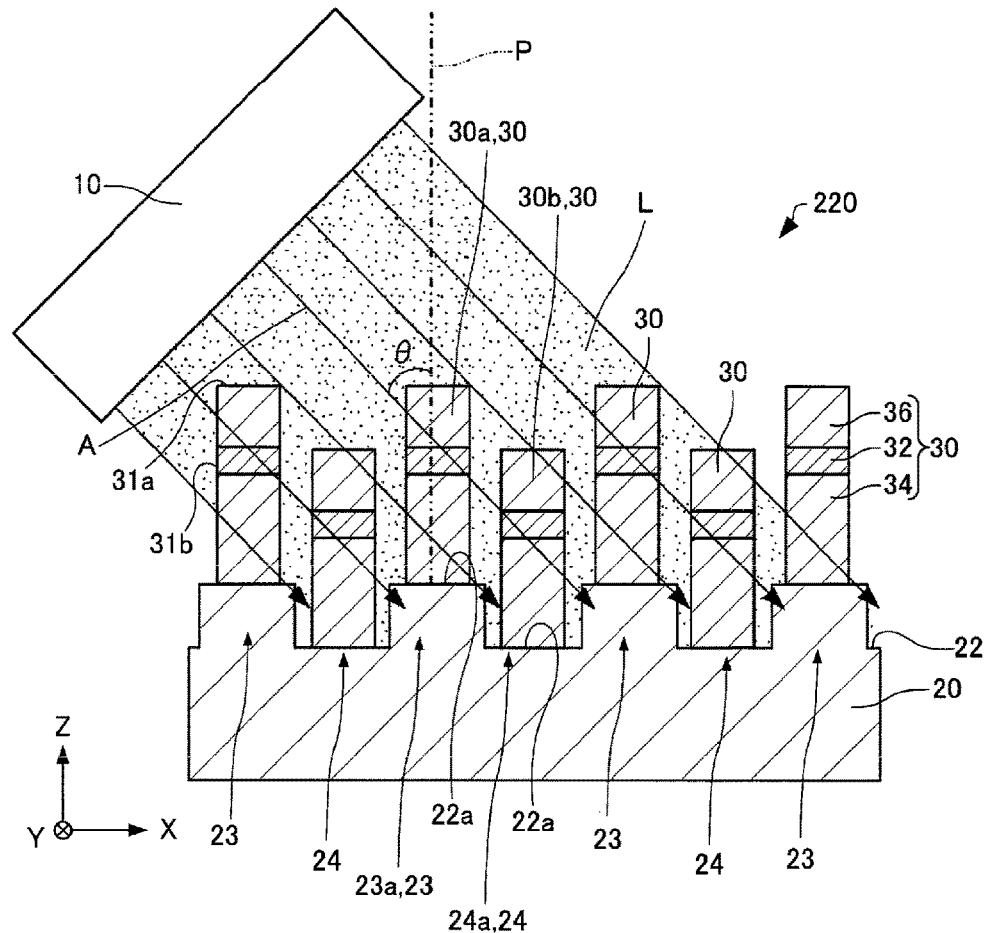
[Fig. 11]
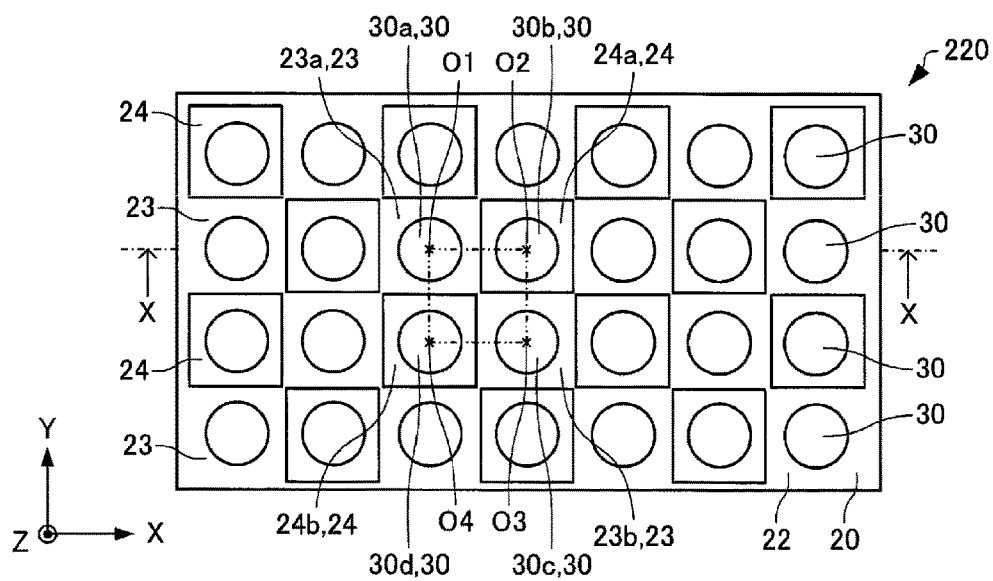

[Fig. 12]
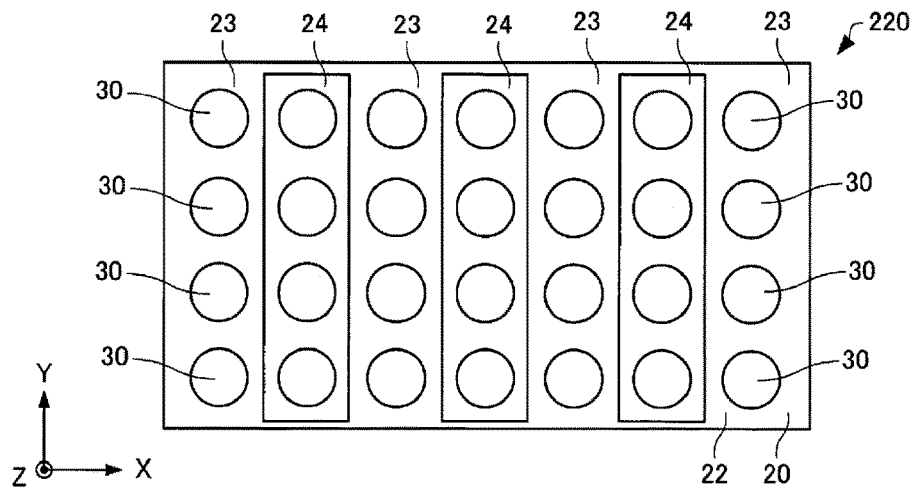
[Fig. 13]
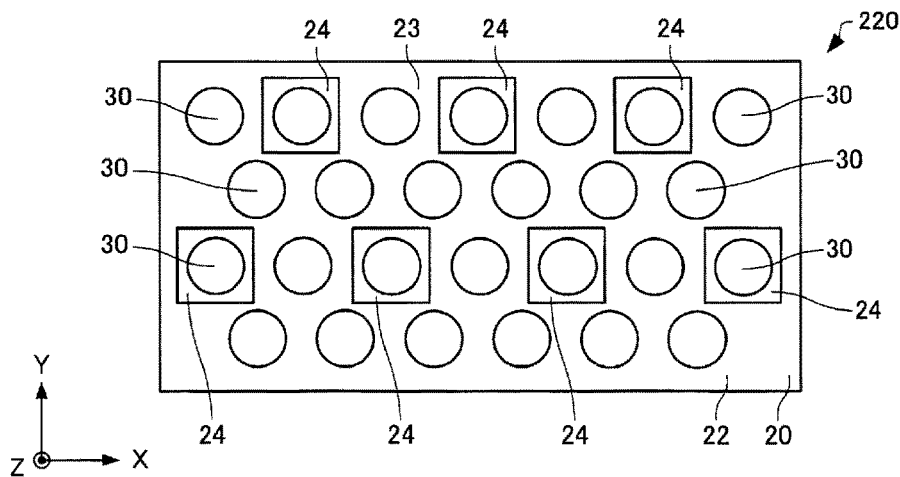
[Fig. 14]
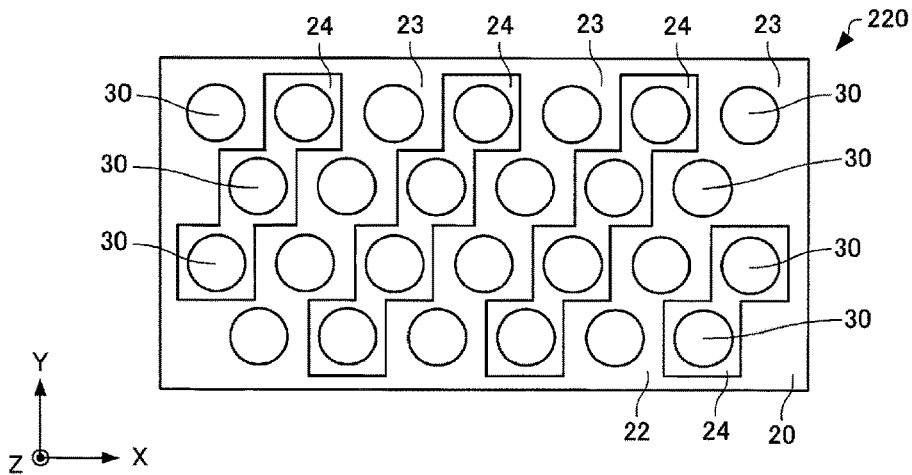

[Fig. 15]
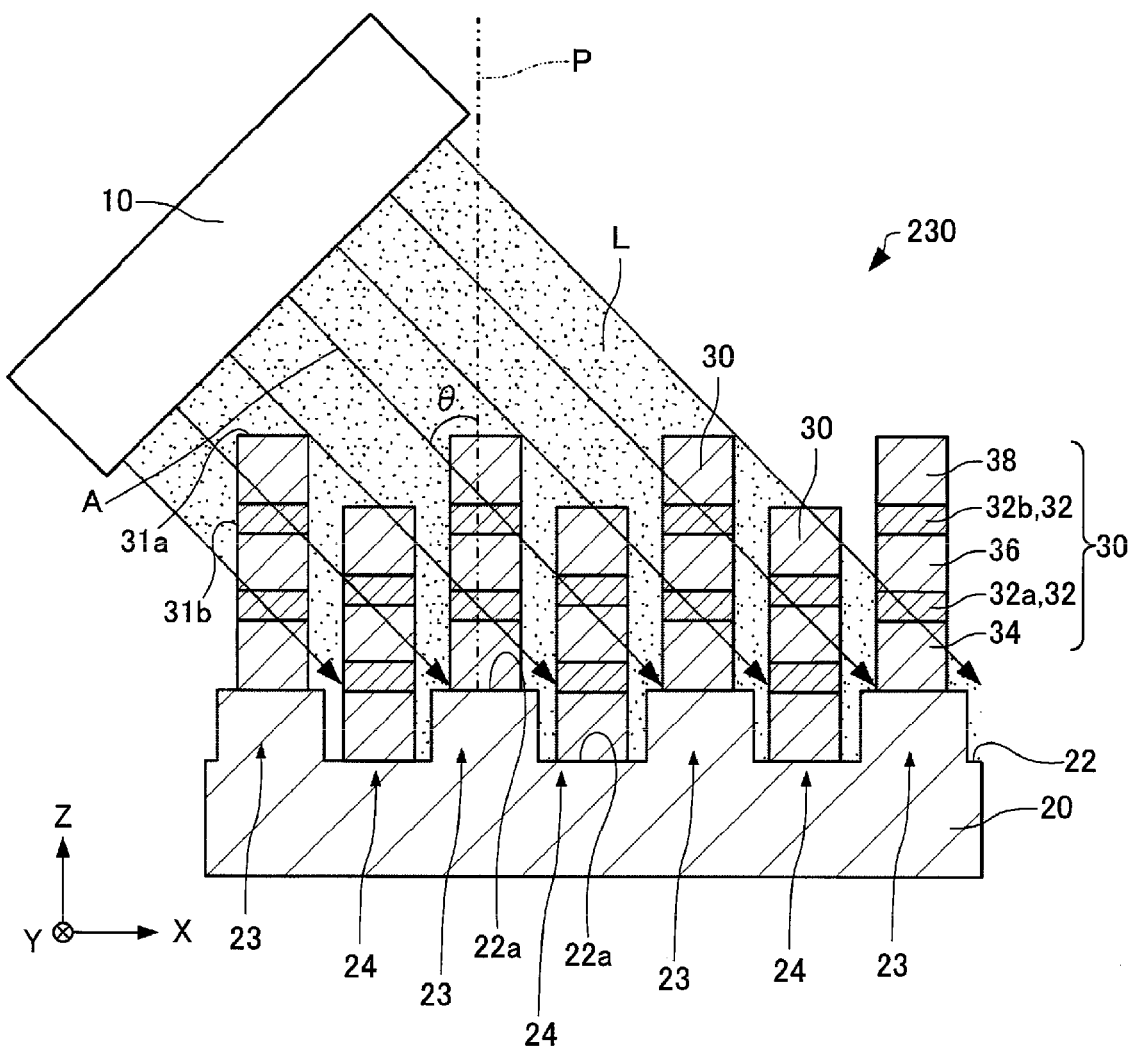

[Fig. 16]
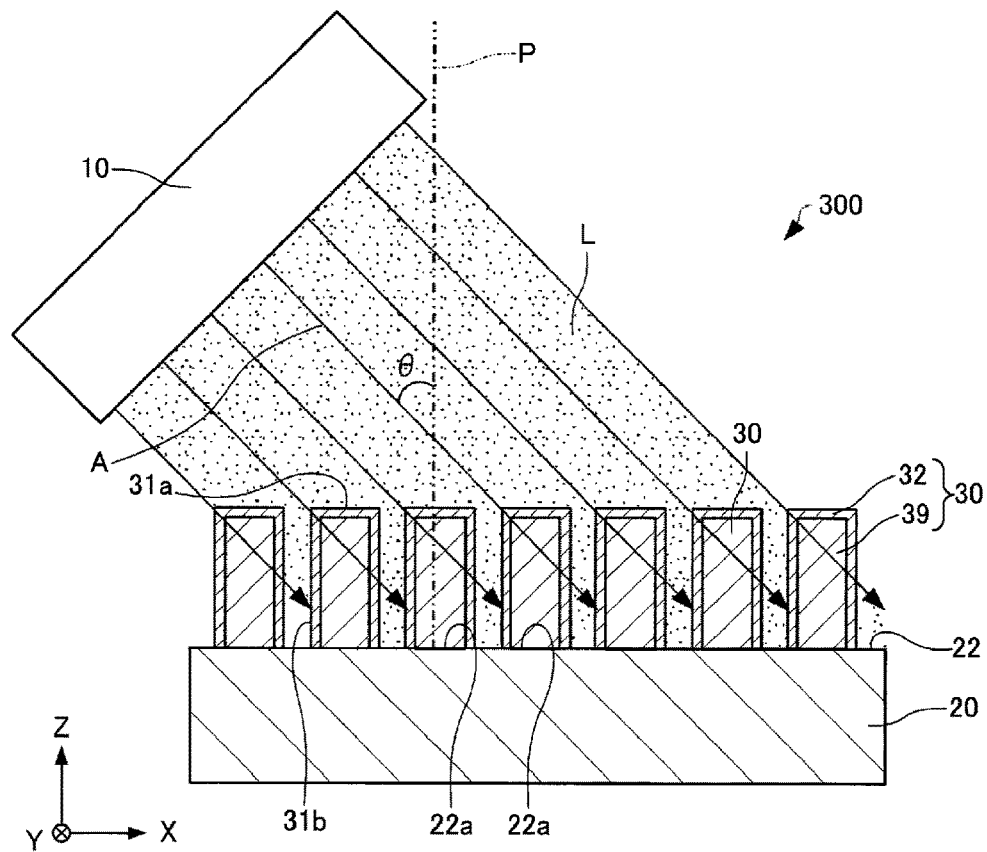
[Fig. 17]
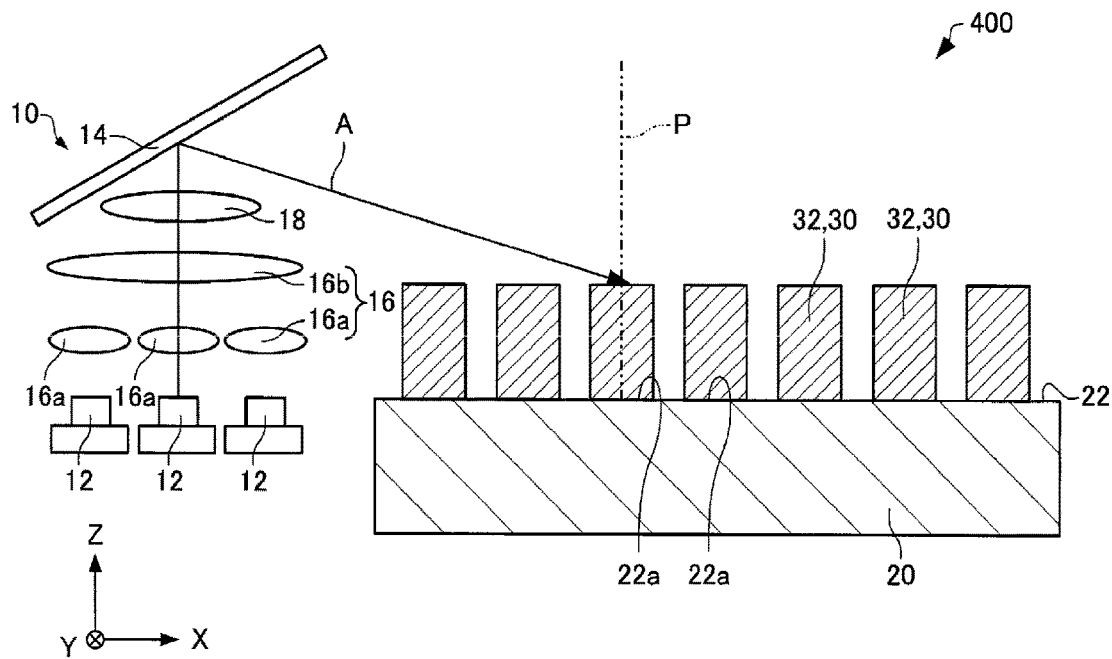

[Fig. 18]
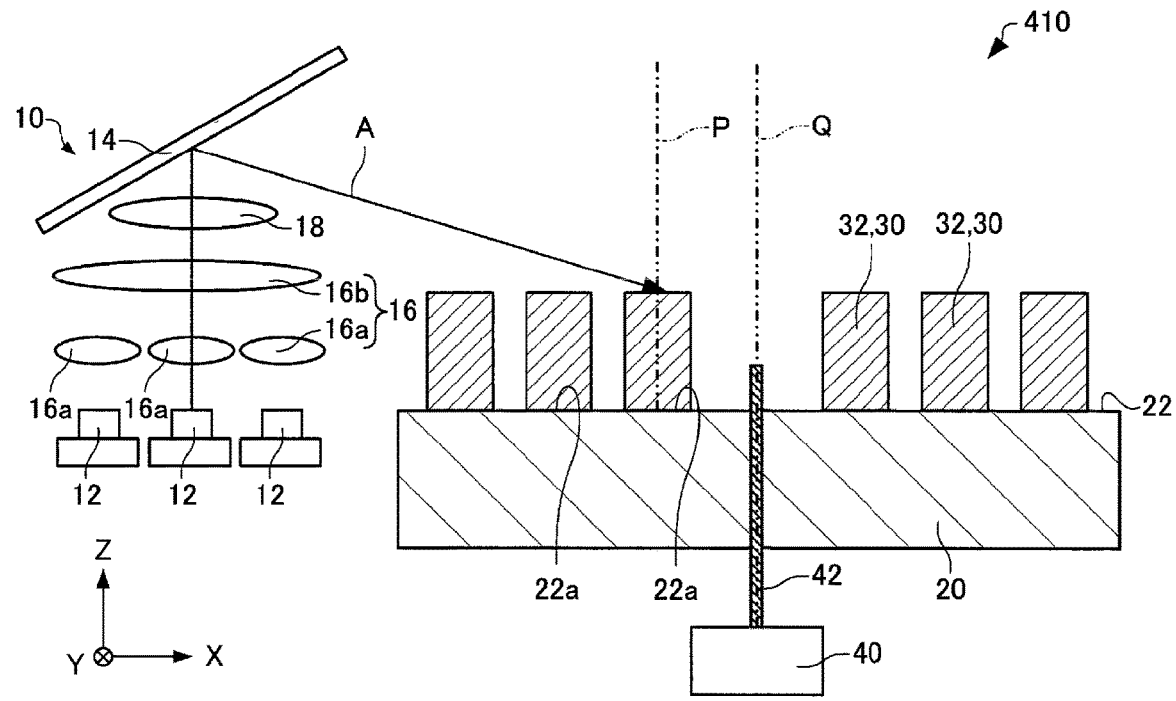
[Fig. 19]
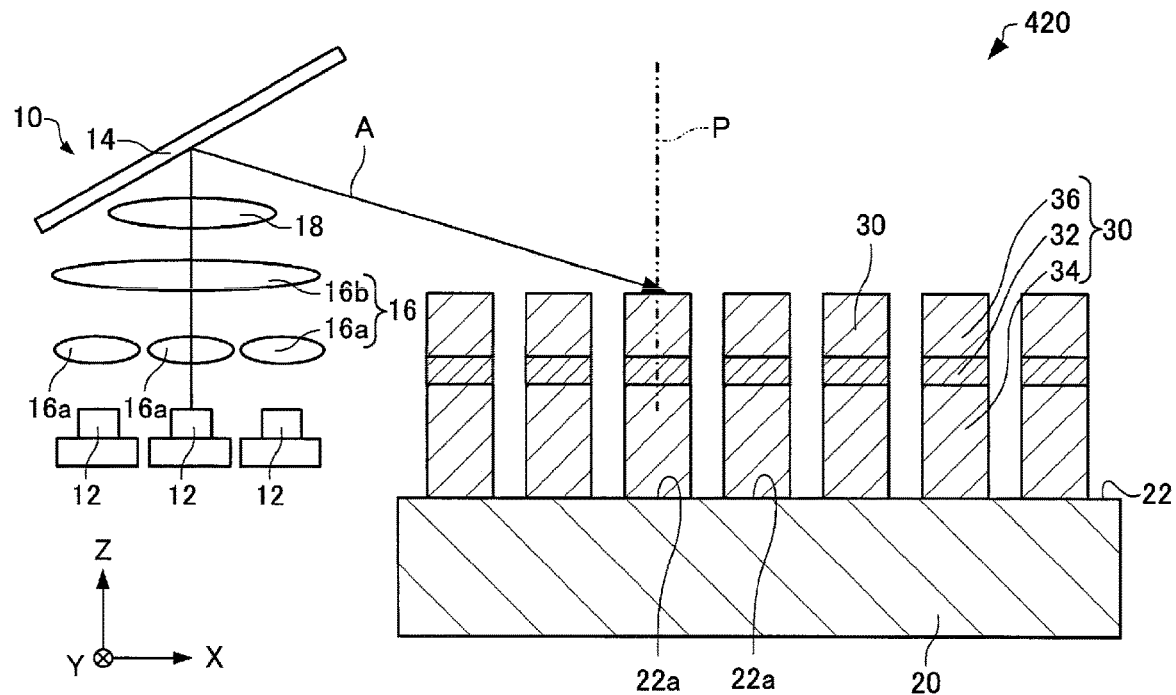

[Fig. 20]
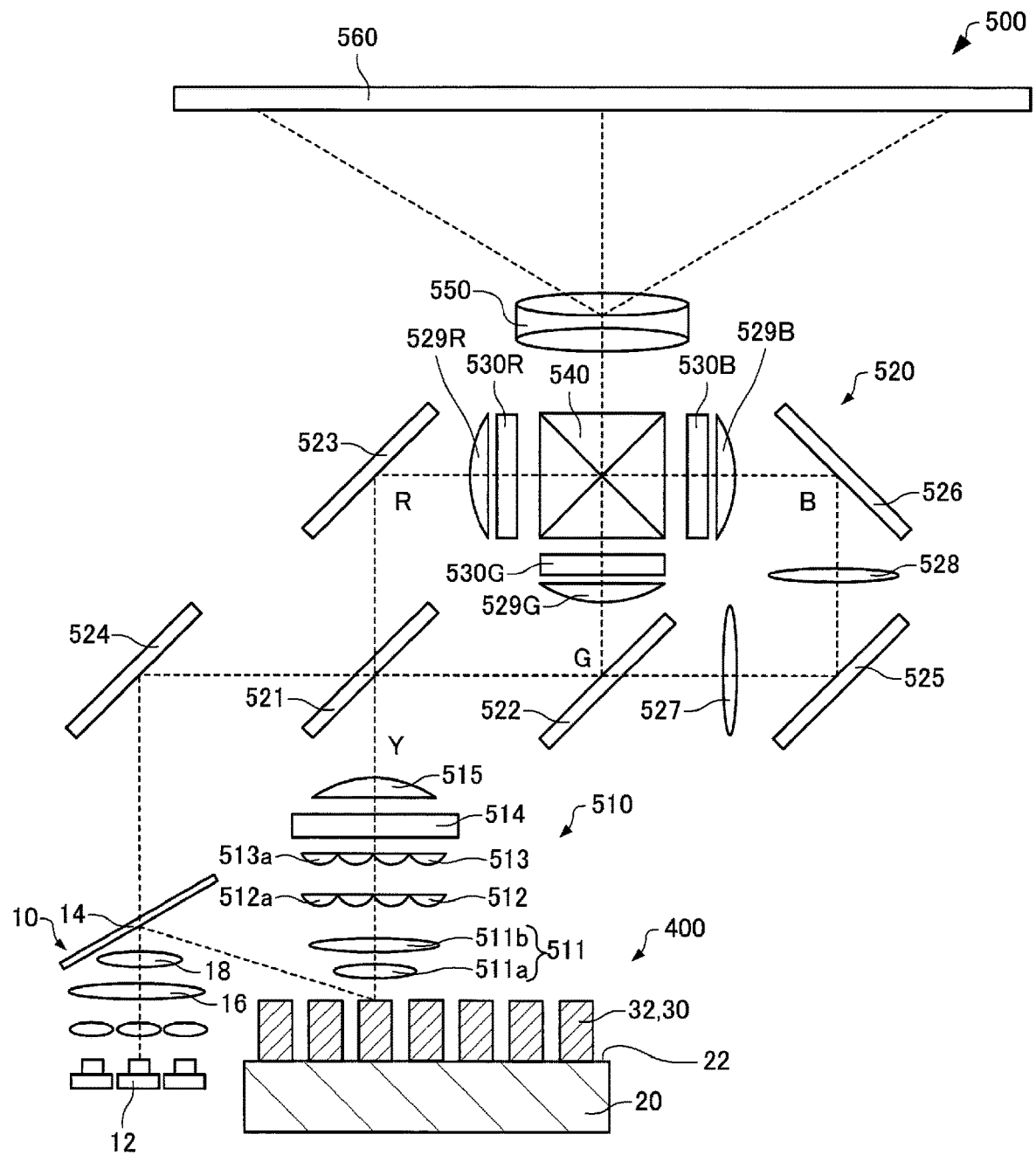

[Fig. 21]
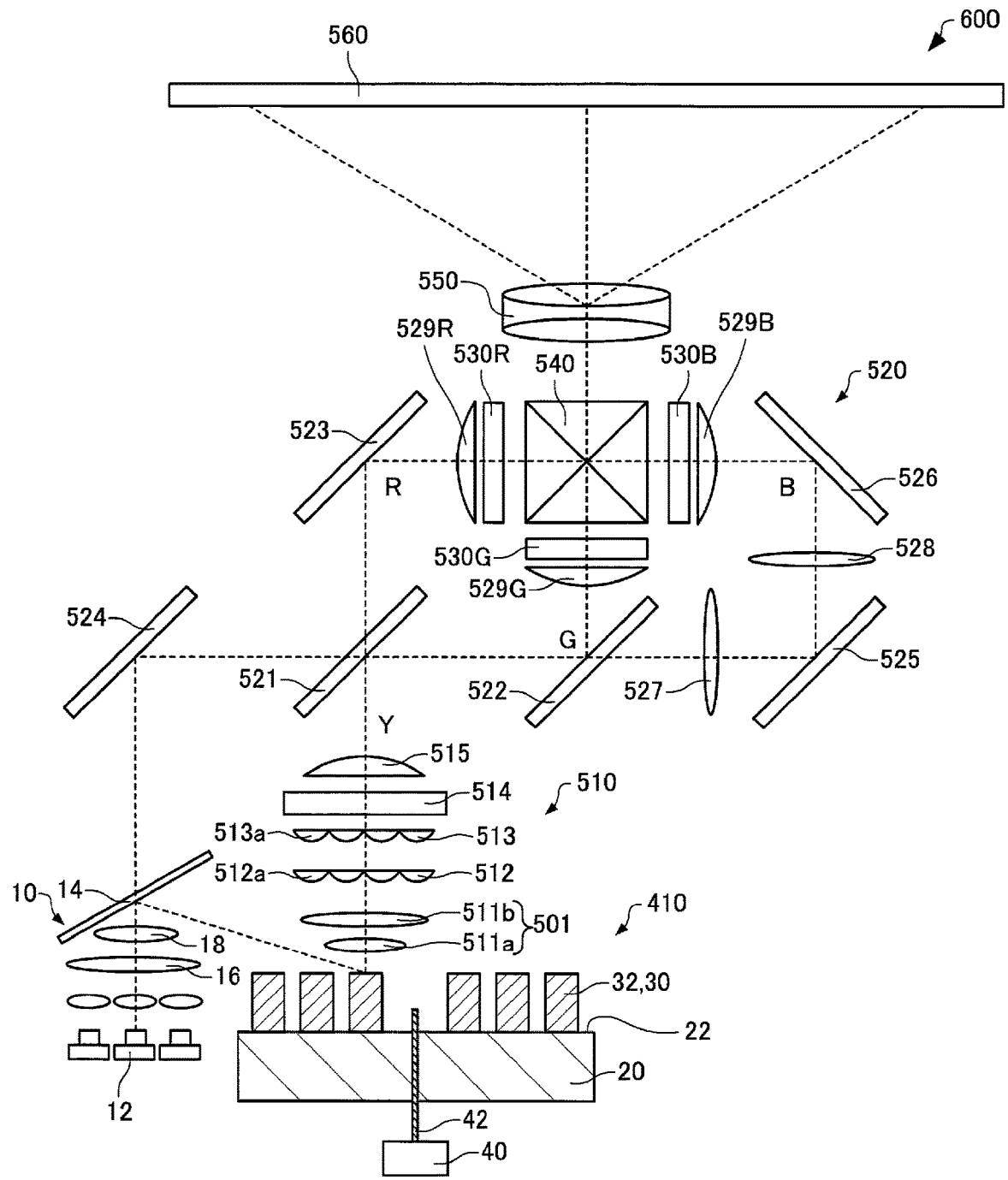

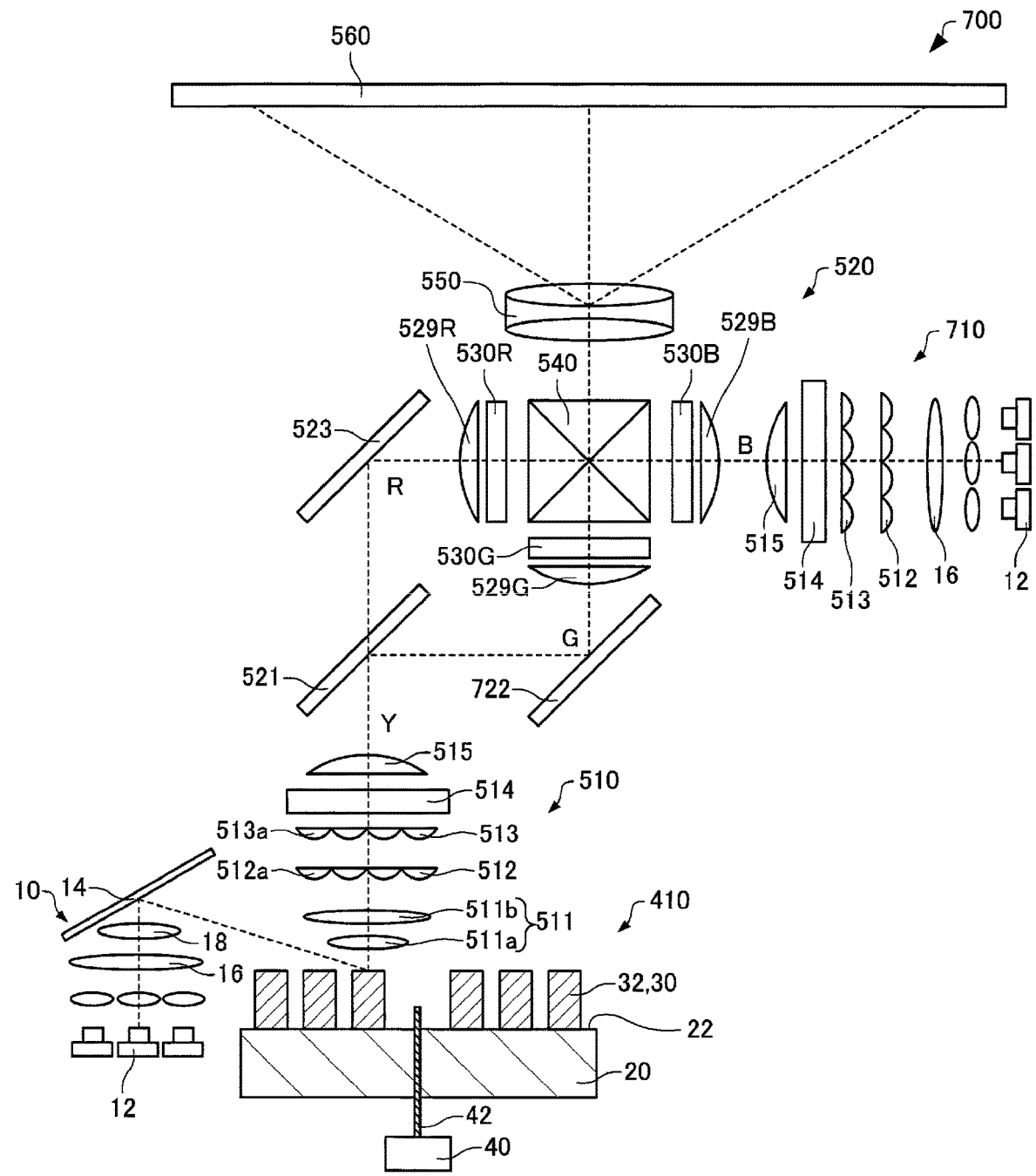
[Fig. 22]

[Fig. 23]
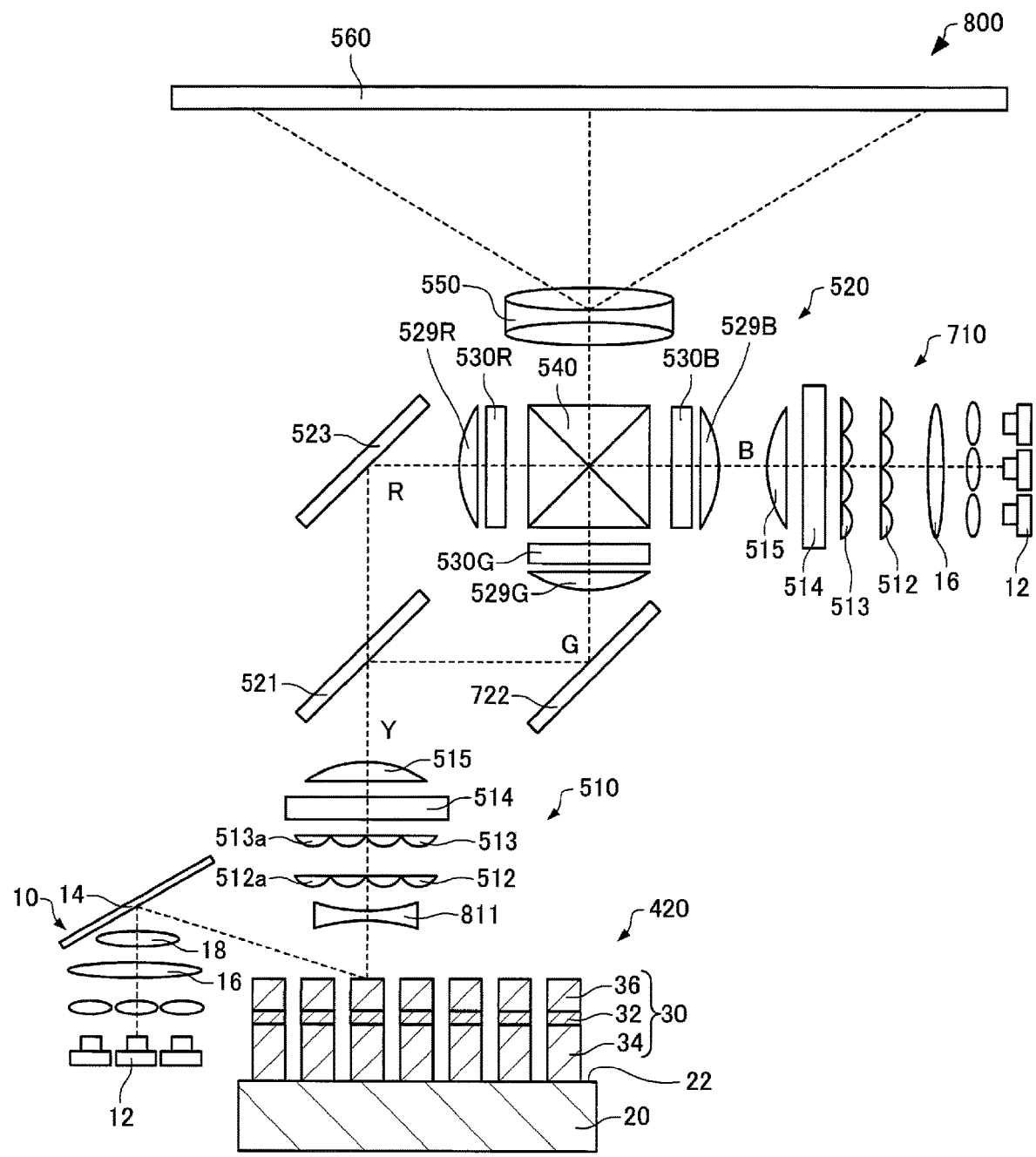

LIGHT EMITTING APPARATUS AND PROJECTOR

The present application is based on, and claims priority from JP Application Serial Number 2017-108388, filed on May 31, 2017, the disclosure of which is hereby incorporated by reference herein in its entirety.

BACKGROUND

1. Technical Field

The present disclosure relates to a light emitting apparatus and a projector.

2. Related Art

In a projector of related art, a discharge lamp, such as an ultrahigh-pressure mercury lamp, is typically used as the light source of the projector. A discharge lamp of this type has, however, problems, such as a relatively short life, difficulty in instantaneous turn-on operation, and degradation of liquid crystal light valves due to ultraviolet light emitted from the lamp. In view of the problems, a projector using a light source based on a scheme different from the schema on which a discharge lamp is based has been proposed.

For example, JP-A-2011-100163 describes a light source apparatus (light emitting apparatus) of a projector including a light emitting plate on which a phosphor layer that receives excitation light and emits light that belongs to a predetermined wavelength range is formed and a light source that radiates the excitation light to the phosphor layer along the direction of a normal to the upper surface of the phosphor layer.

In the light emitting apparatus described above, when the phosphor layer is irradiated with light, the temperature of the phosphor layer increases, resulting in a decrease in light emission efficiency in some cases. To solve the problem, it is conceivable to divide the phosphor layer into a plurality of sections to increase the surface area of the phosphor layer for improvement in heat dissipation.

In the light emitting apparatus including a plurality of divided phosphors, however, part of the excitation light does not enter the phosphor but passes through the gaps between adjacent phosphor sections and enters a base, resulting in a decrease in light emission efficiency in some cases.

SUMMARY

An object according to some aspects of the disclosure is to provide a light emitting apparatus capable of improving light emission efficiency. Another object according to some aspects of the disclosure is to provide a projector that emits light having high luminance.

A light emitting apparatus according to the disclosure includes
a base,
a light source, and
a plurality of columnar sections that are provided at the base and each include a first phosphor that emits light when irradiated with light emitted from the light source, and
the light source radiates the light to the columnar sections obliquely with respect thereto.

The thus configured light emitting apparatus prevents a situation in which the light emitted from the light source does not enter the columnar sections but enters the base. The thus configured light emitting apparatus therefore allows improvement in light emission efficiency.

In the light emitting apparatus according to the disclosure,
an optical axis of the light radiated from the light source to the plurality of columnar section may intersect a columnar direction of the columnar sections.

The thus configured light emitting apparatus prevents the situation in which the light emitted from the light source does not enter the columnar sections but enters the base.

In the light emitting apparatus according to the disclosure,
the columnar sections may each include a first semiconductor layer and a second semiconductor layer so provided as to sandwich the first phosphor,
the first and second semiconductor layers may each have a bandgap greater than energy of the light emitted by the first phosphor, and
the first phosphor, the first semiconductor layer, and the second semiconductor layer may be juxtaposed with each other along the columnar direction.

In the thus configured light emitting apparatus, the first phosphor, the first semiconductor layer, and the second semiconductor layer can form a quantum well structure, whereby electrons can be confined in the first phosphor. The thus configured light emitting apparatus allows improvement in light emission efficiency.

In the light emitting apparatus according to the disclosure,
the columnar sections may each include
a second phosphor that emits light when irradiated with the light radiated from the light source, and
a third semiconductor layer having a bandgap greater than energy of the light emitted by the second phosphor,
the second and third semiconductor layers may be so provided as to sandwich the second phosphor,
the second semiconductor layer may have a bandgap greater than the energy of the light emitted by the second phosphor, and
the first phosphor, the second phosphor, the first semiconductor layer, the second semiconductor layer, and the third semiconductor layer may be juxtaposed with each other along the columnar direction.

In the thus configured light emitting apparatus, focus, for example, on adjacent ones out of the columnar sections, and the light emitted from the light source enters the second phosphor in one of the columnar sections, passes through the one columnar section, and can then enter the first phosphor in the other columnar section. The thus configured light emitting apparatus allows improvement in light emission efficiency.

In the light emitting apparatus according to the disclosure,
a first surface of the base may have a protruding/recessed shape,
first columnar sections out of the plurality of columnar sections may be provided at first protruding sections that form the protruding/recessed shape of the first surface, and
second columnar sections out of the plurality of columnar sections may be provided at first recessed sections that form the protruding/recessed shape of the first surface.

In the thus configured light emitting apparatus, the light emitted from the light source enters the first phosphor in any of the first columnar sections, passes through the first columnar section, and can then enter the first phosphor in the second columnar section adjacent to the first columnar section. The thus configured light emitting apparatus allows improvement in light emission efficiency.

In the light emitting apparatus according to the disclosure, third columnar sections out of the plurality of columnar sections may be provided at second protruding sections that form the protruding/recessed shape of the first surface, fourth columnar sections out of the plurality of columnar sections may be provided at second recessed sections that form the protruding/recessed shape of the first surface, when viewed along the columnar direction, the second columnar sections may be so provided as to be shifted from the first columnar sections in a first direction, the fourth columnar sections may be so provided as to be shifted from the first columnar sections in a second direction that intersects the first direction, the third columnar sections may be so provided as to be shifted from the second columnar sections in the second direction and shifted from the fourth columnar sections in the first direction, and a distance between a center of each of the first columnar sections and a center of the second columnar section adjacent to the first columnar section, a distance between the center of each of the first columnar sections and a center of the fourth columnar section adjacent to the first columnar section, a distance between the center of each of the second columnar sections and a center of the third columnar section adjacent to the second columnar section, and a distance between the center of each of the third columnar sections and the center of the fourth columnar section adjacent to the third columnar section may be equal to one another.

The thus configured light emitting apparatus, when the light is caused to enter the columnar sections along the first or second direction, allows the light having entered the first phosphor in the columnar section provided at any of the protruding sections and passed through the columnar section to enter the first phosphor in the columnar section provided at the recessed section adjacent to the protruding section.

The light emitting apparatus according to the disclosure may include a driver that rotates the base around an axis extending in the columnar direction as an axis of rotation.

The thus configured light emitting apparatus can avoid a situation in which the same region of the columnar sections is irradiated with the light emitted from the light source so that the region is melted.

In the light emitting apparatus according to the disclosure, the columnar sections may each have a hexagonal shape in a plan view viewed in the columnar direction.

In the light emitting apparatus according to the disclosure, the light source may include a light emitting device that emits light, and an optical element that deflects an optical axis of the light emitted from the light emitting device.

The thus configured light emitting apparatus allows the light emitted from the light emitting device to enter the columnar sections via the optical element. The thus configured light emitting apparatus therefore allows an increase in flexibility of the arrangement of the light emitting device.

A projector according to the disclosure includes a base, a light source, and a plurality of columnar sections that are provided at the base and each include a phosphor that emits light when irradiated with light emitted from the light source, and the light source radiates the light to the columnar sections obliquely with respect thereto.

The thus configured projector can emit light having high luminance.

BRIEF DESCRIPTION OF THE DRAWINGS

FIG. 1 is a cross-sectional view diagrammatically showing a light emitting apparatus according to a first embodiment.

FIG. 2 is a plan view diagrammatically showing the light emitting apparatus according to the first embodiment.

FIG. 3 is a plan view diagrammatically showing the light emitting apparatus according to the first embodiment.

FIG. 4 is a cross-sectional view diagrammatically showing a light emitting apparatus according to a reference example.

FIG. 5 is a plan view diagrammatically showing the light emitting apparatus according to the first embodiment.

FIG. 6 is a cross-sectional view diagrammatically showing the light emitting apparatus according to the first embodiment.

FIG. 7 is a cross-sectional view diagrammatically showing the light emitting apparatus according to the first embodiment.

FIG. 8 is a cross-sectional view diagrammatically showing a light emitting apparatus according to a second embodiment.

FIG. 9 is a cross-sectional view diagrammatically showing a light emitting apparatus according to a first variation of the second embodiment.

FIG. 10 is a cross-sectional view diagrammatically showing a light emitting apparatus according to a second variation of the second embodiment.

FIG. 11 is a plan view diagrammatically showing the light emitting apparatus according to the second variation of the second embodiment.

FIG. 12 is a plan view diagrammatically showing the light emitting apparatus according to the second variation of the second embodiment.

FIG. 13 is a plan view diagrammatically showing the light emitting apparatus according to the second variation of the second embodiment.

FIG. 14 is a plan view diagrammatically showing the light emitting apparatus according to the second variation of the second embodiment.

FIG. 15 is a cross-sectional view diagrammatically showing a light emitting apparatus according to a third variation of the second embodiment.

FIG. 16 is a cross-sectional view diagrammatically showing a light emitting apparatus according to a third embodiment.

FIG. 17 is a cross-sectional view diagrammatically showing a light emitting apparatus according to a fourth embodiment.

FIG. 18 is a cross-sectional view diagrammatically showing a light emitting apparatus according to a first variation of the fourth embodiment.

FIG. 19 is a cross-sectional view diagrammatically showing a light emitting apparatus according to a second variation of the fourth embodiment.

FIG. 20 diagrammatically shows a projector according to a fifth embodiment.

FIG. 21 diagrammatically shows a projector according to a first variation of the fifth embodiment.

FIG. 22 diagrammatically shows a projector according to a second variation of the fifth embodiment.

FIG. 23 diagrammatically shows a projector according to a third variation of the fifth embodiment.

DESCRIPTION OF EXEMPLARY EMBODIMENTS

Preferable embodiments of the disclosure will be described below in detail with reference to the drawings. It is not intended that the embodiments described below unduly limit the contents of the disclosure set forth in the claims. All configurations described below are not necessarily essential configuration requirements of the disclosure.

1. First Embodiment

1.1. Light Emitting Apparatus

A light emitting apparatus according to a first embodiment will first be described with reference to the drawings. FIG. 1 is a cross-sectional view diagrammatically showing a light emitting apparatus 100 according to the first embodiment. FIG. 2 is a plan view diagrammatically showing the light emitting apparatus 100 according to the first embodiment. FIG. 1 is the cross-sectional view taken along the line I-I in FIG. 2. In FIGS. 1 and 2, axes X, Y, and Z are shown as three axes perpendicular to one another.

The light emitting apparatus 100 includes a light source 10, a base 20, and columnar sections 30, as shown in FIGS. 1 and 2. The light source 10 is omitted in FIG. 2 for convenience.

The light source 10 emits light L, which causes phosphors 32 in the columnar sections 30 to be excited (excitation light). The light source 10 emits the light L obliquely with respect to a first surface 22 of the base 20. Specifically, the light source 10 emits the light L obliquely with respect to columnar section formation regions 22a. The columnar section formation regions 22a are regions of the first surface 22 of the base 20 that are the regions where the columnar sections 30 are provided. The light L emitted from the light source 10 (hereinafter also simply referred to as "light L") has an optical axis A, which intersects a normal P to any of the columnar section formation regions 22a. In the example shown in FIG. 1, the normal P is parallel to the axis Z. The light L enters the columnar sections 30 along a direction that intersects the normal P.

The light source 10 radiates the light L to the columnar sections 30 obliquely with respect thereto. The phrase "radiating the light L to the columnar sections 30 obliquely with respect thereto" means that radiating the light L obliquely with respect to a columnar direction of the columnar sections 30, that is, radiating the light in such a way that the columnar direction of the columnar sections 30 intersects the direction of the optical axis A of the light L. The term "columnar direction" is the direction of a center line a, which links a center point C1 to a center point C2, with the center point C1 being the center point of a bottom surface 130 of any of the columnar sections 30 in a plan view viewed along the normal P and the center point C2 being the center point of a cross section 132 of the columnar section 30 that is the cross section viewed in the plan view along the normal P and located in the position that is half the height of the columnar section 30 (maximum dimension of columnar section 30 along normal P). In a case where the bottom surface 130 has a shape other than a circular shape, "the center point C1 of the bottom surface 130" is the center of a minimum circle containing the shape of the bottom surface 130 (minimum enclosing circle). Further, in the case where the bottom surface 130 has a shape other than a circular shape, "the center point C2 of the cross section 132" is the center of a minimum circle containing the shape of the cross section 132. Moreover, "the cross section 132 of the columnar section 30 located in the position that is half the height of the columnar section 30" means the cross section perpendicular to the center line a of the columnar section 30 in the position that is half the height of the columnar section 30.

In the example shown in FIG. 1, the columnar direction is the direction of the normal P.

The optical axis A of the light L radiated from the light source 10 to the plurality of columnar sections 30 intersects the columnar direction of the columnar sections 30. The optical axis A is, for example, an axis parallel to a light ray having the highest intensity out of the light rays that form the light L. The direction of the optical axis A (direction in which optical axis A extends) intersects the thickness direction of the base 20. An angle θ between the normal P and the optical axis A is, for example, greater than or equal to 5° but smaller than or equal to 45°, preferably, greater than or equal to 20° but smaller than or equal to 40°.

The light L emitted (radiated) from the light source 10 is, for example, blue light. The wavelength of the light L is, for example, longer than or equal to 435 nm but shorter than or equal to 480 nm. The light source 10 is formed, for example, of a light emitting device, such as a laser or a light emitting diode (LED). The light source 10 may be formed of light emitting devices arranged in an array.

The base 20 is so shaped, for example, as to form a planar plate. The base 20 has the first surface 22. In the example shown in FIG. 1, the first surface 22 is a flat surface. The base 20 is made, for example, of Al, Cu, GaN, or sapphire. The base 20 may be formed of a laminate of a sapphire substrate and a GaN layer having the first surface 22.

The columnar sections 30 are provided on the first surface 22 of the base 20. Specifically, the columnar sections 30 are provided in the columnar section formation regions 22a of the first surface 22. The columnar section formation regions 22a are in contact with the columnar sections 30. The columnar sections 30 are made, for example, of a material that transmits the light L.

The columnar sections 30 each have a columnar shape that protrudes from the first surface 22 along the normal P. The light L is incident on an upper surface 31a of each of the columnar sections 30 (surface facing positive side of axis Z) and a side surface 31b of the columnar section 30 (surface perpendicular to upper surface 31a).

The columnar sections 30 are provided at a plurality of locations. The plurality of columnar sections 30 are so provided as to be separate from each other. In the example shown in FIG. 2, the plurality of columnar sections 30 are arranged in a square lattice in the plan view (viewed along axis Z). The light L enters the columnar sections 30 along the axis X or Y in the plan view.

The width of each of the columnar sections 30 (size in direction perpendicular to normal P) is, for example, greater than or equal to 10 nm but smaller than or equal to 5 μm. The height of each of the columnar sections 30 (size along normal P) is, for example, greater than or equal to 0.1 μm but smaller than or equal to 10 μm. The distance between adjacent columnar sections 30 is, for example, greater than or equal to 5 nm but smaller than or equal to 5 μm.

The columnar sections 30 each have, for example, a circular planar shape (shape viewed along axis Z). The columnar sections 30 may each have an elliptical planar shape (shape of columnar sections 30 in plan view viewed along normal P) or a polygonal planar shape, such as a quadrangular or hexagonal shape (see FIG. 3). In the example shown in FIG. 2, the width of each of the columnar sections 30 does not change along the normal P and may instead change.

The columnar sections 30 each contain the phosphor 32. In the example shown in FIGS. 1 and 2, the columnar sections 30 are each formed of the phosphor 32. The phosphor 32 emit light when the light L emitted from the light source 10 enters the phosphor 32. Specifically, for example, the phosphor 32 absorbs the light L and emits light in the form of fluorescence. The fluorescence occurs particularly at the surface of the phosphor 32. The light L may or may not enter the base 20 as long as the light L enters the phosphor 32. In the disclosure, the phosphor refers to a substance that emits light when irradiated with light, is not limited to a substance that emits light in the form of fluorescence, and includes, for example, a substance that emits light in the form of phosphorescence.

The light emitted by the phosphor 32 is, for example, yellow light. The wavelength of the light emitted by the phosphor 32 is, for example, longer than or equal to 580 nm but shorter than or equal to 595 nm. The phosphor 32 is made, for example, of sialon (ceramic material made of silicon, aluminum, oxygen, and nitrogen), YAG (crystal material having garnet structure and made of yttrium and aluminum), or InGaN.

The light emitting apparatus 100 has, for example, the following features.

The light emitting apparatus 100 includes the plurality of columnar sections 30, which are provided on the base 20 and made of the phosphor 32, which emits light when irradiated with the light L emitted from the light source 10, and the light source 10 radiates the light to the columnar sections 30 obliquely with respect thereto. That is, the light source 10 radiates the light to the columnar sections 30 obliquely with respect to the columnar direction of the columnar sections 30. The light emitting apparatus 100 therefore prevents a situation in which the light L emitted from the light source 10 does not enter the columnar sections 30 but enters the base 20. The light emitting apparatus 100 therefore allows improvement in light emission efficiency. A decrease in the intensity of the light L therefore still allows the light emitting apparatus 100 to maintain the intensity of the light emitted from the phosphor 32. Therefore, for example, in the case where the light emitting apparatus 100 is so configured that a plurality of light emitting devices form the light source 10, the number of light emitting devices can be reduced. As a result, the light emitting apparatus 100 allows cost reduction. Further, since the light emitting apparatus 100 allows a decrease in the intensity of the light L, the life of the light source 10 can be prolonged. It is noted in the disclosure that the state in which the light L is so radiated to the columnar sections 30 that the columnar direction of the columnar sections 30 intersects the direction of the optical axis A is expressed as follows: the light L is radiated to the columnar sections 30 obliquely with respect thereto or the light L is radiated to the columnar sections 30 obliquely with respect to the columnar direction of the columnar sections 30.

For example, in a case where the optical axis A of the light L emitted from a light source 1010 is parallel to the normal P to any columnar section formation region 1022a (a case where the columnar direction of columnar sections 1030 coincides with the direction of the optical axis A), part of the light L radiated from the light source 1010 does not enter the columnar sections 1030 but enters a base 1020, as shown in FIG. 3. The light emitting apparatus 100 allows improvement in light emission efficiency as compared with that of the light emitting apparatus shown in FIG. 3.

Further, the light emitting apparatus 100, for example, allows the light having passed through a columnar section 30 to enter an adjacent columnar section 30. The light emitting apparatus 100 therefore allows improvement in light emission efficiency. The angle θ can be so set as appropriate, for example, that the light L having passed through a columnar section 30 enters a columnar section 30 adjacent thereto.

Further, in the light emitting apparatus 100, the plurality of columnar sections 30 are so provided as to be separate from each other. The light emitting apparatus 100 therefore allows the total surface area of the columnar sections 30 (sum of surface areas of plurality of columnar sections 30) to increase as compared with a case where the plurality of columnar sections 30 are continuously provided with no gap therebetween. The light emitting apparatus 100 therefore allows improvement in heat dissipation.

In the light emitting apparatus 100, the optical axis A of the light L radiated from the light source 10 to the plurality of columnar sections 30 intersects the columnar direction of the columnar sections 30. The light emitting apparatus 100 can therefore avoid the situation in which the light L does not enter the columnar sections 30 but enters the base 20.

The plurality of columnar sections 30 may instead be arranged in a triangular lattice in the plan view, as shown in FIG. 5. In this case, the light L enters the columnar sections 30 along a direction inclining by 60° with respect to the axis X or along the axis X in the plan view. FIG. 5 does not show the light source 10 for convenience.

Although not shown, the plurality of columnar sections 30 may instead be provided in the form of stripes in the plan view.

In the example shown in FIG. 1, the columnar direction coincides with the direction of the normal P, but not necessarily. For example, the columnar direction may not coincide with the direction of the normal P, as shown in FIG. 6. In the example shown in FIG. 6, the normal P and the optical axis A are parallel to each other.

In the example shown in FIG. 1, the size of the columnar sections 30 along the axis Z is greater than the size of the columnar sections 30 along the axis X, but not necessarily. For example, the size of the columnar sections 30 along the axis Z may be smaller than the size of the columnar sections 30 along the axis X, as shown in FIG. 7. Also in the example shown in FIG. 7, the columnar direction coincides with the direction of the axis Z (direction of normal P), as in the example shown in FIG. 1.

1.2. Method for Manufacturing Light Emitting Apparatus

A method for manufacturing the light emitting apparatus 100 according to the first embodiment will next be described with reference to the drawings.

The plurality of columnar sections 30 are formed on the first surface 22 of the base 20, as shown in FIG. 1. Specifically, for example, a light emitting film (not shown) is first deposited, for example, by using chemical vapor deposition (CVD) or sputtering. The light emitting film is then patterned, for example, by photolithography and etching. The plurality of columnar sections 30 can thus be formed.

The light source 10 is then disposed in a position where the light source 10 can emit the light L obliquely with respect to the first surface 22.

The light emitting apparatus 100 can be manufactured by carrying out the steps described above.

The columnar sections 30 are not necessarily formed by using the method described above. The columnar sections 30 may instead be formed, for example, by forming a mask layer (not shown) having a predetermined shape on the first surface 22 and causing the light emitting film to undergo crystal growth with the mask layer serving as a mask, for example, by using metal organic chemical vapor deposition (MOCVD) or molecular beam epitaxy (MBE).

In a case where the columnar direction does not coincide with the direction of the normal P, as shown in FIG. 6, the columnar sections 30 may be formed, for example, by using an oblique etching technology.

2. Second Embodiment

2.1. Light Emitting Apparatus

A light emitting apparatus according to a second embodiment will next be described with reference to the drawings. FIG. 8 is a cross-sectional view diagrammatically showing a light emitting apparatus 200 according to the second embodiment. In FIG. 8, axes X, Y, and Z are shown as three axes perpendicular to one another.

In the light emitting apparatus 200 according to the second embodiment in the following description, a member having the same function as that of a constituent member of the light emitting apparatus 100 described above has the same reference character and will not be described in detail.

In the light emitting apparatus 100 described above, the columnar sections 30 are each formed of the phosphor 32, as shown in FIG. 1. In contrast, in the light emitting apparatus 200, the columnar sections 30 each include the phosphor 32, a first semiconductor layer 34, and a second semiconductor layer 36, as shown in FIG. 8. In the example shown in FIG. 8, the columnar sections 30 are each formed of the phosphor 32 and the semiconductor layer 34 and 36.

The first semiconductor layer 34 is provided on the first surface 22 of the base 20. The first semiconductor layer 34 and the second semiconductor layer 36 are so provided as to sandwich the phosphor 32. The phosphor 32 and the semiconductor layers 34 and 36 are juxtaposed with each other along the normal P (along columnar direction).

The first semiconductor layer 34 and the second semiconductor layer 36 each have, for example, a bandgap wider than the bandgap of the phosphor 32 or a bandgap greater than the energy of the light emitted by the phosphor 32. The semiconductor layers 34 and 36 each have, for example, a refractive index smaller than the refractive index of the phosphor 32. The semiconductor layers 34 and 36 are each a cladding layer having the function of confining the light in the phosphor 32 (preventing light from leaking out of phosphor 32). The semiconductor layers 34 and 36 are each, for example, a GaN layer. The phosphor 32 is, for example, an InGaN layer.

In the light emitting apparatus 200, for example, the semiconductor layers 34 and 36 cause the light produced in the phosphor 32 to propagate in the directions perpendicular to the normal P, and the light forms a standing wave for laser oscillation. The light emitting apparatus 200 then emits, for example, positive first-order diffracted light and negative first-order diffracted light as laser light along the normal P (toward positive and negative sides of axis Z).

Although not shown, a reflection layer may be provided between the base 20 and the columnar sections 30 or on one side of the base 20 that is the side facing the negative side of the axis Z. The reflection layer is, for example, a distributed Bragg reflector (DBR) layer. The reflection layer can reflect the light produced in the phosphor 32 and allows the light emitting apparatus 200 to emit the light, for example, only via the side facing the positive side of the axis Z.

The light emitting apparatus 200 can provide the same effects as those provided by the light emitting apparatus 100 described above.

In the light emitting apparatus 200, the columnar sections 30 each include the first semiconductor layer 34 and the second semiconductor layer 36, which are so provided as to sandwich the phosphor 32, and the first semiconductor layer 34 and the second semiconductor layer 36 each have, for example, a bandgap wider than the bandgap of the phosphor 32 or a bandgap greater than the energy of the light emitted by the phosphor 32. Therefore, in the light emitting apparatus 200, the phosphor 32 and the semiconductor layers 34 and 36 can form a quantum well structure, whereby electrons can be confined in the phosphor 32. The light emitting apparatus 200 therefore allows improvement in light emission efficiency.

Further, in the light emitting apparatus 200, the semiconductor layers 34 and 36 are each a cladding layer having the function of confining the light in the phosphor 32. The light emitting apparatus 200 therefore allows efficient laser oscillation.

Although not shown, the spaces between adjacent columnar sections 30 may each be filled, for example, with a member having a refractive index smaller than the refractive index of the phosphor 32. The member may be a member that dissipates heat by a greater amount than the phosphor 32 and the semiconductor layers 34 and 36.

Although not shown, in the light emitting apparatuses according to the disclosure, the columnar sections 30 may each have a multiple quantum well structure (MQW) in which the structure in which the semiconductor layers 34 and 36 sandwich the phosphor 32 is repeated along the normal P. In this case, the semiconductor layers 34 and 36 do not function as the cladding layers, and the columnar sections 30 may each separately include a first cladding layer and a second cladding layer that sandwich a laminate of multiple quantum well structures.

2.2. Method for Manufacturing Light Emitting Apparatus

A method for manufacturing the light emitting apparatus 200 according to the second embodiment will next be described. The method for manufacturing the light emitting apparatus 200 according to the second embodiment is basically the same as the method for manufacturing the light emitting apparatus 100 according to the first embodiment described above except that the first semiconductor layer 34, the phosphor 32, and the second semiconductor layer 36 are formed in the presented order on the first surface 22 of the base 20. The method for manufacturing the light emitting apparatus 200 will therefore not be described in detail.

2.3. Variations of Light Emitting Apparatus

2.3.1. First Variation

A light emitting apparatus according to a first variation of the second embodiment will next be described with reference to the drawings. FIG. 9 is a cross-sectional view diagrammatically showing a light emitting apparatus 210 according to the first variation of the second embodiment. In FIG. 9 and FIGS. 10 to 15, which are shown below, axes X, Y, and Z are shown as three axes perpendicular to one another.

In the light emitting apparatus 210 according to the first variation of the second embodiment in the following description, a member having the same function as that of constituent members of the light emitting apparatuses 100 and 200 described above has the same reference character and will not be described in detail.

In the light emitting apparatus 200 described above, the columnar sections 30 each include one phosphor 32, the first semiconductor layer 34, and the second semiconductor layer 36, as shown in FIG. 8. In contrast, in the light emitting apparatus 210, the columnar sections 30 each include two phosphors 32 (first phosphor 32a and second phosphor 32b), the first semiconductor layer 34, the second semiconductor layer 36, and a third semiconductor layer 38, as shown in FIG. 9. The third semiconductor layer 38 is made, for example, of the same material of which the semiconductor layers 34 and 36 are made.

The first semiconductor layer 34 and the second semiconductor layer 36 are so provided as to sandwich the first phosphor 32a. The second semiconductor layer 36 and the third semiconductor layer 38 are so provided as to sandwich the second phosphor 32b. The phosphors 32a and 32b and the semiconductor layers 34, 36, and 38 are juxtaposed with each other along the normal P.

The first semiconductor layer 34, the second semiconductor layer 36, and third semiconductor layer 38 each have a bandgap wider than the bandgap of the first phosphor 32a and the second phosphor 32b or a bandgap greater than the energy of the light emitted by the phosphors 32a and 32b. The semiconductor layers 34, 36, and 38 each have, for example, a refractive index smaller than the refractive index of the phosphors 32a and 32b. The semiconductor layers 34 and 36 are each a cladding layer having the function of confining the light in the first phosphor 32a. The semiconductor layers 36 and 38 are each a cladding layer having the function of confining the light in the second phosphor 32b.

Focus, for example, on adjacent ones out of the columnar sections 30, and the light L emitted from the light source 10 enters the second phosphor 32b in one of the columnar sections 30, passes through the one columnar section 30, and then enters the first phosphor 32a in the other columnar section 30.

In the light emitting apparatus 210, for example, the light produced in any of the first phosphors 32a is caused by the semiconductor layers 34 and 36 to propagate in the directions perpendicular to the normal P, and the light forms a standing wave for laser oscillation. The light emitting apparatus 210 then emits, for example, positive first-order diffracted light and negative first-order diffracted light as laser light along the normal P. Further, in the light emitting apparatus 210, for example, the light produced in any of the second phosphors 32b is caused by the semiconductor layers 36 and 38 to propagate in the directions perpendicular to the normal P, and the light forms a standing wave for laser oscillation. The light emitting apparatus 210 then emits, for example, positive first-order diffracted light and negative first-order diffracted light as laser light along the normal P.

The light emitting apparatus 210 can provide the same effects as those provided by the light emitting apparatus 200 described above.

The first semiconductor layer 34 and the second semiconductor layer 36 are so provided as to sandwich the first phosphor 32a, the second semiconductor layer 36 and the third semiconductor layer 38 are so provided as to sandwich the second phosphor 32b, and the first semiconductor layers 34, 36, and 38 each have, for example, a bandgap wider than the bandgap of the phosphors 32a and 32b or a bandgap greater than the energy of the light emitted by the phosphors 32a and 32b. Therefore, in the light emitting apparatus 210, focus, for example, on adjacent ones out of the columnar sections 30, the light L emitted from the light source 10 enters the second phosphor 32b in one of the columnar sections 30, passes through the one columnar section 30, and can then enter the first phosphor 32a in the other columnar section 30. The light emitting apparatus 210 therefore allows improvement in light emission efficiency as compared with the case where the columnar sections 30 each include only one phosphor 32.

Although not shown, the columnar sections 30 may each include three or more phosphors 32. In this case, the three or more phosphors 32 may each be sandwiched between semiconductor layers made of the same material of which the semiconductor layers 34, 36, and 38 are made.

2.3.2. Second Variation

A light emitting apparatus according to a second variation of the second embodiment will next be described with reference to the drawings. FIG. 10 is a cross-sectional view diagrammatically showing a light emitting apparatus 220 according to the second variation of the second embodiment. FIG. 11 is a plan view diagrammatically showing the light emitting apparatus 220 according to the second variation of the second embodiment. FIG. 10 is the cross-sectional view taken along the line X-X in FIG. 11. FIG. 10 does not show the light source 10 for convenience.

In the light emitting apparatus 220 according to the second variation of the second embodiment in the following description, a member having the same function as that of constituent members of the light emitting apparatuses 100, 200, and 210 described above has the same reference character and will not be described in detail.

In the light emitting apparatus 200 described above, the first surface 22 of the base 20 is a flat surface, as shown in FIG. 8. In contrast, in the light emitting apparatus 220, the first surface 22 of the base 20 has a protruding/recessed shape, as shown in FIGS. 10 and 11.

A plurality of protruding sections 23 and recessed sections 24 are provided to form the protruding/recessed shape of the first surface 22. The protruding sections 23 and the recessed sections 24 each have, for example, a square planar shape. In the example shown in FIG. 11, the plurality of protruding sections 23 are provided continuously with each other, and the plurality of recessed sections 24 are provided separately from each other. Although not shown, the plurality of protruding sections 23 may be provided separately from each other, and the plurality of recessed sections 24 may be provided continuously with each other.

The protruding sections 23 and the recessed sections 24 are alternately arranged along the axis X in the plan view, as shown in FIG. 11. Further, the protruding sections 23 and the recessed sections 24 are alternately arranged along the axis Y in the plan view. The protruding sections 23 and the recessed sections 24 are provided in a staggered pattern.

The protruding sections 23 are provided with part of the columnar sections 30. Specifically, part of the columnar sections 30 are provided in the columnar section formation regions 22a where the protruding sections 23 are formed. The recessed sections 24 are provided with part of the columnar sections 30. Specifically, part of the columnar sections 30 are provided in the columnar section formation regions 22a where the recessed sections 24 are formed.

First columnar sections 30a out of the plurality of columnar sections 30 are provided at first protruding sections 23a out of the plurality of protruding sections 23. Second columnar sections 30b out of the plurality of columnar sections 30 are provided at first recessed sections 24a out of the plurality of recessed sections 24. Third columnar sections 30c out of the plurality of columnar sections 30 are provided at second protruding sections 23b out of the plurality of protruding sections 23. Fourth columnar sections 30d out of the plurality of columnar sections 30 are provided at second recessed sections 24b out of the plurality of recessed sections 24.

The first columnar sections 30a and the second columnar sections 30b are so provided as to be adjacent to each other along the axis X. The first columnar sections 30a and the fourth columnar sections 30d are so provided as to be adjacent to each other along the axis Y. The second columnar sections 30b and the third columnar sections 30c are so provided as to be adjacent to each other along the axis Y. The third columnar sections 30c and the fourth columnar sections 30d are so provided as to be adjacent to each other along the axis X.

Focus on adjacent ones of the columnar sections 30, the position of the phosphor 32 in one of the columnar sections 30 along the axis Z differs from the position of the phosphor 32 in the other columnar section 30 along the axis Z. The light L emitted from the light source 10 enters the phosphor 32 in one of the adjacent columnar sections 30, passes through the one columnar section 30, and then enters the phosphor 32 in the other columnar section 30. The light L emitted from the light source 10 enters the columnar sections 30 along the axis X or Y in the plan view.

In the light emitting apparatus 220, the angle θ between the optical axis A and the normal P can be so adjusted as appropriate that the light L having entered the phosphor 32 in the columnar section 30 provided at any of the protruding sections 23 and passed through the columnar section 30 enters the phosphor 32 in the columnar section 30 provided at the adjacent recessed section 24.

In the plan view, the second columnar sections 30b are so provided as to be shifted from the first columnar sections 30a in a first direction (toward the positive side of axis X in the example shown in FIG. 11). The fourth columnar sections 30d are so provided as to be shifted from the first columnar sections 30a in a second direction that intersects the first direction (toward the negative side of axis Y in the example shown in FIG. 11). The third columnar sections 30c are so provided as to be shifted from the second columnar sections 30b toward the negative side of axis Y and shifted from the fourth columnar sections 30d toward the positive side of axis X.

In the plan view, the distance between a center O1 of each of the first columnar sections 30a and a center O2 of the second columnar section 30b adjacent to the first columnar section 30a, the distance between the center O1 of each of the first columnar sections 30a and a center O4 of the fourth columnar section 30d adjacent to the first columnar section 30a, the distance between the center O2 of each of the second columnar sections 30b and a center O3 of the third columnar section 30c adjacent to the second columnar section 30b, and the distance between the center O3 of each of the third columnar sections 30c and the center O4 of the fourth columnar section 30c adjacent to the third columnar section 30c are equal to one another.

In the example shown in FIG. 11, the line segment that links each of the centers O1 to the center O2 adjacent thereto, the line segment that links each of the centers O1 to the center O4 adjacent thereto, the line segment that links each of the centers O2 to the center O3 adjacent thereto, and the line segment that links each of the centers O3 to the center O4 adjacent thereto form a square in the plan view. The phrase "the center of a columnar section 30" is, in a case where the columnar section 30 has a polygonal planar shape, the center of the minimum circle (circle having minimum radius) containing the polygonal shape.

The light emitting apparatus 220 can provide the same effects as those provided by the light emitting apparatus 200 described above.

In the light emitting apparatus 220, the first columnar sections 30a are provided at the first protruding sections 23, and the second columnar sections 30b are provided at the first recessed sections 24a. The light emitting apparatus 220 therefore allows the position of the phosphor 32 in each of the first columnar sections 30a to differ from the position of the phosphor 32 in each of the second columnar sections 30b. The light emitting apparatus 220 therefore allows the light L emitted from the light source 10 to enter the phosphors 32 in the first columnar sections 30a, pass through the first columnar sections 30a, and then enter the phosphors 32 in the second columnar sections 30b. The light emitting apparatus 220 therefore allows improvement in light emission efficiency.

Further, the light emitting apparatus 220, in which the first columnar sections 30a are provided at the first protruding sections 23, and the second columnar sections 30b are provided at the first recessed sections 24a, allows improvement in heat dissipation as compared with the case where the plurality of columnar sections 30 are provided on a flat surface.

In the light emitting apparatus 220, the third columnar sections 30c are provided at the second protruding sections 23b, and the fourth columnar sections 30d are provided at the second recessed sections 24b; in the plan view, the second columnar sections 30b are so provided as to be shifted from the first columnar sections 30a toward the positive side of the axis X, the fourth columnar sections 30d are so provided as to be shifted from the first columnar sections 30a toward the negative side of the axis Y, and the third columnar sections 30c are so provided as to be shifted from the second columnar sections 30b toward the negative side of the axis Y and shifted from the fourth columnar sections 30d toward the positive side of the axis X; and the distance between the center O1 and the center O2 adjacent thereto, the distance between the center O1 and the center O4 adjacent thereto, the distance between the center O2 and the center O3 adjacent thereto, and the distance between the center O3 and the center O4 adjacent thereto are equal to one another. The light emitting apparatus 220, in which the light L enters the columnar sections 30 along the axis X or Y, therefore allows the light L having entered the phosphor 32 in the columnar section 30 provided at any of the protruding sections 23 and passed through the columnar section 30 to enter the phosphor 32 in the columnar section provided at the recessed section 24 adjacent to the protruding section 23. The light emitting apparatus 220 thus has high versatility because the light emission efficiency can be improved irrespective of the direction in which the light L enters the columnar sections 30, that is, along the axis X or Y.

The arrangement of the protruding sections 23 and the recessed sections 24 is not limited to the exemplary arrangement shown in FIG. 11. For example, the recessed sections 24 may each have a planar shape elongated along the axis Y, and a plurality of the columnar sections 30 may be provided at one recessed section 24, as shown in FIG. 12. In the example shown in FIG. 12, the recessed sections 24 each have an oblong planar shape, and four columnar sections 30 are provided at one recessed section 24. The protruding sections 23 and the recessed sections 24 may be alternately arranged along the axis X, as shown in FIG. 12. In the case shown in FIG. 12, the light L enters the columnar sections 30 in the direction inclining by 45° with respect to the axis X or along the axis X. In FIG. 12 and FIGS. 13 and 14 shown in below, the light source 10 is omitted for convenience.

Instead, in the plan view, the plurality of columnar sections 30 may be arranged in a triangular lattice, and the plurality of recessed sections 24 may be arranged in a triangular lattice, as shown in FIG. 13. In this case, the light L enters the columnar sections 30 in the direction inclining by 60° with respect to the axis X or along the axis X.

Still instead, in the plan view, the plurality of columnar sections 30 may be arranged in a triangular lattice, and a plurality of the columnar sections 30 juxtaposed with each other in the direction inclining by 45° with respect to the axis X may be provided at one recessed section 24, as shown in FIG. 14. The protruding sections 23 and the recessed sections 24 may be alternately arranged along the axis X, as shown in FIG. 14. In the case shown in FIG. 14, the light L enters the columnar sections 30 in the direction inclining by 60° with respect to the axis X or along the axis X.

Although not shown, the first surface 22 of the base 20 may be a flat surface, and the plurality of columnar sections 30 may have different heights.

2.3.3. Third Variation

A light emitting apparatus according to a third variation of the second embodiment will next be described with reference to the drawings. FIG. 15 is a cross-sectional view diagrammatically showing a light emitting apparatus 230 according to the third variation of the second embodiment.

In the light emitting apparatus 230 according to the third variation of the second embodiment in the following description, a member having the same function as that of constituent members of the light emitting apparatuses 100, 200, 210, and 220 described above has the same reference character and will not be described in detail.

The light emitting apparatus 230 has a configuration that is the combination of the light emitting apparatus 210 and the light emitting apparatus 220 described above. That is, in the light emitting apparatus 230, the columnar sections 30 each include the first phosphor 32a, the second phosphor 32b, the first semiconductor layer 34, the second semiconductor layer 36, and the third semiconductor layer 38. Further, in the light emitting apparatus 230, the first surface 22 of the base 20 has the protruding/recessed shape.

The light emitting apparatus 230 allows greater improvement in light emission efficiency, for example, than the light emitting apparatuses 210 and 220.

3. Third Embodiment 3.1. Light Emitting Apparatus

A light emitting apparatus according to a third embodiment will next be described with reference to the drawings. FIG. 16 is a cross-sectional view diagrammatically showing a light emitting apparatus 300 according to the third embodiment. In FIG. 16, axes X, Y, and Z are shown as three axes perpendicular to one another.

In the light emitting apparatus 300 according to the third embodiment in the following description, a member having the same function as that of a constituent member of the light emitting apparatus 100 described above has the same reference character and will not be described in detail.

In the light emitting apparatus 100 described above, the columnar sections 30 are each formed of the phosphor 32, as shown in FIG. 1. In contrast, in the light emitting apparatus 300, the columnar sections 30 each include the phosphor 32 and a base section 39, as shown in FIG. 16. In the example shown in FIG. 16, the columnar sections 30 are each formed of the phosphor 32 and the base section 39.

The base section 39 is provided on the first surface 22 of the base 20. The base section 39 protrudes from the first surface 22 toward the positive side of the axis Z. The base section 39 has a columnar shape. The base section 39 is made, for example, of a material that is more readily formed in a columnar shape than the material of the phosphor 32 and is specifically made of a semiconductor material, such as GaN or InGaN.

The phosphor 32 is so provided as to cover the base section 39. The phosphor 32 is so formed, for example, as to cover the entire outer surface of the base section 39 (a surface of the base section 39 that is the surface that is not in contact with the first surface 22). In the example shown in FIG. 16, the phosphor 32 is in contact with the first surface 22.

The light emitting apparatus 300 can provide the same effects as those provided by the light emitting apparatus 100 described above.

In the light emitting apparatus 300, the columnar sections 30 are provided on the first surface 22 of the base 20 and include the base sections 39 each having a columnar shape, and the phosphors 32 are so provided as to cover the base sections 39. Therefore, in the light emitting apparatus 300, the base sections 39 can be made of a material that is readily formed in a columnar shape as compared with the case where the columnar sections 30 are each formed only of the phosphor 32, whereby the size of the columnar sections 30 along the axis Z can be increased. The light emitting apparatus 300 therefore allows an increase in the surface area of each of the phosphors 32 and improvement in heat dissipation.

3.2. Method for Manufacturing Light Emitting Apparatus

A method for manufacturing the light emitting apparatus 300 according to the third embodiment will next be described. The method for manufacturing the light emitting apparatus 300 according to the third embodiment is basically the same as the method for manufacturing the light emitting apparatus 100 according to the first embodiment described above except that the base sections 39 are formed on the first surface 22 of the base 20 by using MOCVD or MBE and then the phosphors 32 are so formed as to cover the base sections 39. The method for manufacturing the light emitting apparatus 300 will therefore not be described in detail.

4. Fourth Embodiment 4.1. Light Emitting Apparatus

A light emitting apparatus according to a fourth embodiment will next be described with reference to the drawings. FIG. 17 is a cross-sectional view diagrammatically showing a light emitting apparatus 400 according to the fourth embodiment. In FIG. 17, axes X, Y, and Z are shown as three axes perpendicular to one another.

In the light emitting apparatus 400 according to the fourth embodiment in the following description, a member having the same function as that of a constituent member of the light emitting apparatus 100 described above has the same reference character and will not be described in detail.

The light emitting apparatus 400 differs from the light emitting apparatuses described above in that the light source 10 includes light emitting devices 12, which each emit light, and an optical element 14, which deflects the optical axis A of the light from each of the light emitting devices 12, as shown in FIG. 17. The light source 10 of the light emitting apparatus 400 further includes a light collection system 16 and a lens 18.

The light emitting devices 12 are each, for example, a laser or an LED. The light emitting devices 12 are provided, for example, at a plurality of locations (three in the example shown in FIG. 17). In the example shown in FIG. 17, the light emitting devices 12 each emit light along the axis Z.

The light emitted from each of the light emitting devices 12 enters the light collection system 16. The light collection system 16 includes lenses 16a, which are a plurality of convex lenses, and a lens 16b, which is a convex lens on which light beams having passed through the plurality of lenses 16a are incident and which is common to the lenses 16a. The light collection system 16 is so disposed that the optical axes A of the light beams emitted from the light emitting devices 12 pass through the light collection system 16 and collects the light beams emitted from the plurality of light emitting devices 12.

The light having exited out of the light collection system 16 is incident on the lens 18. The lens 18 parallelizes the light beams emitted from the light emitting devices 12.

The light having exited out of the lens 18 is incident on the optical element 14. The optical element 14 reflects the light beams from the light emitting devices 12 obliquely with respect to the first surface 22 of the base 20 so that the optical axes A of the light beams are deflected. The light source 10 can thus emit the light to the first surface 22 obliquely with respect thereto. The optical element 14 is, for example, a mirror. In the present disclosure, the state in which the light source 10 radiates the light L to the columnar sections 30 obliquely with respect thereto is an expression including a state in which the columnar sections 30 are obliquely and directly irradiated with the light L from the light source 10 and a state in which the columnar sections are obliquely irradiated with the light L from the light source 10 with the optical axis A of the light L deflected by the optical element 14 (with the direction of the optical axis A changed).

The optical element 14 is not limited to a mirror and may, for example, be a prism, a grating, or a half-silvered mirror as long as the columnar sections 30 are obliquely irradiated with the light L from the light source 10. The optical element 14 may still instead be a computer generated hologram (CGH). In the case where the optical element 14 is a CGH, the intensity distribution of the light emitted from the light source 10 may be so controlled that the uniformity of the intensity distribution of the light increases.

The light emitting apparatus 400 can provide the same effects as those provided by the light emitting apparatus 100 described above.

In the light emitting apparatus 400, the light source 10 includes the light emitting devices 12, which each emit light, and the optical element 14, which deflects the optical axes A of the light beams emitted from the light emitting devices 12. The light emitting apparatus 400 therefore allows the light beams emitted from the light emitting devices 12 to enter the columnar sections 30 via the optical element 14. The light emitting apparatus 400 therefore allows an increase in flexibility of the arrangement of the light emitting devices 12.

4.2. Method for Manufacturing Light Emitting Apparatus

A method for manufacturing the light emitting apparatus 400 according to the fourth embodiment will next be described. The method for manufacturing the light emitting apparatus 400 according to the fourth embodiment is basically the same as the method for manufacturing the light emitting apparatus 100 according to the first embodiment described above except that the light emitting devices 12, the optical element 14, the light collection system 16, and the lens 18 are disposed in predetermined positions. The method for manufacturing the light emitting apparatus 400 will therefore not be described in detail.

4.3. Variations of Light Emitting Apparatus
4.3.1. First Variation

Alight emitting apparatus according to a first variation of the fourth embodiment will next be described with reference to the drawings. FIG. 18 is a cross-sectional view diagrammatically showing a light emitting apparatus 410 according to the first variation of the fourth embodiment. In FIG. 18 and FIG. 19, which is shown below, axes X, Y, and Z are shown as three axes perpendicular to one another.

In the light emitting apparatus 410 according to the first variation of the fourth embodiment in the following description, a member having the same function as that of constituent members of the light emitting apparatuses 100 and 400 described above has the same reference character and will not be described in detail.

The light emitting apparatus 410 differs from the light emitting apparatus 400 described above in that the light emitting apparatus 410 includes a driver 40, which rotates the base 20 around an axis (imaginary axis) Q parallel to the normal P as the axis of rotation, as shown in FIG. 18. The axis of rotation Q is an axis extending in the columnar direction. The light emitting apparatus 400 further includes a support shaft 42.

The driver 40 is, for example, a motor. The support shaft 42 couples the driver 40 to the base 20. The support shaft 42 extends from the driver 40 to the base 20 along the axis Z. The support shaft 42 is provided along the axis of rotation Q. When the driver 40 is driven, the support shaft 42 rotates. The base 20 can thus rotate around the axis of rotation Q. The axis of rotation Q may pass through the center of the base 20 in the plan view. In the example shown in FIG. 18, the columnar sections 30 are so provided as not to interfere with the axis of rotation Q.

The light emitting apparatus 410 can provide the same effects as those provided by the light emitting apparatus 400 described above.

The light emitting apparatus 410 includes the driver 40, which rotates the base 20 around the axis Q parallel to the normal P as the axis of rotation. The light emitting apparatus 410 can therefore avoid a situation in which the same region of the columnar sections 30 is irradiated with the light emitted from the light source 10 so that the region is melted.

4.3.2. Second Variation

A light emitting apparatus according to a second variation of the fourth embodiment will next be described with reference to the drawings. FIG. 19 is a cross-sectional view diagrammatically showing a light emitting apparatus 420 according to the second variation of the fourth embodiment.

In the light emitting apparatus 420 according to the second variation of the fourth embodiment in the following description, a member having the same function as that of constituent members of the light emitting apparatuses 100, 200, and 400 described above has the same reference character and will not be described in detail.

In the light emitting apparatus 420, the columnar sections 30 each include the phosphor 32, the first semiconductor layer 34, and the second semiconductor layer 36, as shown in FIG. 19.

The light emitting apparatus 420 can provide the same effects as those provided by the light emitting apparatuses 200 and 400 described above.

Although not shown, in the light emitting apparatuses 210, 220, 230, and 300 described above, the light source 10 may include the light emitting devices 12, the optical element 14, the light collection system 16, and the lens 18. Further, although not shown, the light emitting apparatuses 100, 200, 210, 220, 230, and 300 described above may include the driver 40 and the support shaft 42.

5. Fifth Embodiment

5.1. Projector

A projector according to a fifth embodiment will next be described with reference to the drawings. FIG. 20 diagrammatically shows a projector 500 according to the fifth embodiment.

The projector according to the disclosure includes any of the light emitting apparatuses according to the disclosure. The following description will be made of a projector 500 including the light emitting apparatus 400 as the light emitting apparatus according to the disclosure.

The projector 500 includes an enclosure (not shown) and a light source module 510, a color separation system 520, liquid crystal light valves (light modulators) 530R, 530G, and 530B, a light combiner 540, and a projection system 550, which are all provided in the enclosure.

The projector 500 generally operates as follows: Light emitted from the light source module 510 is separated by the color separation system 520 into a plurality of color light fluxes. The plurality of separated color light fluxes from the color separation system 520 are incident on and modulated by the corresponding liquid crystal light valves 530R, 530G, and 530B. The plurality of color light fluxes modulated by the liquid crystal light valves 530R, 530G, and 530B enter the light combiner 540, which combines the color light fluxes with one another. The combined light from the light combiner 540 is enlarged by the projection system 550, which projects the enlarged combined light on a screen 560. A full-color projection image is thus displayed.

The components that form the projector 500 will be described below.

The light source module 510 includes the light emitting apparatus 400, a collimation system 511, lens arrays 512 and 513, a polarization converter 514, and a superimposing lens 515.

The light emitting apparatus 400 receives the light emitted from the light source 10 and emits the light emitted from the phosphors 32. The phosphors 32 receives the blue light emitted from the light source 10 and emit the yellow light. The optical element 14 is a half-silvered mirror. Part of the blue light emitted from the light source 10 passes the optical element 14.

The collimation system 511 includes a lens 511*a*, which prevents the light emitted from the phosphors 32 from spreading, and a lens 511*b*, which parallelizes the light having exited out of the lens 511*a*. The collimation system 511 as a whole parallelizes the light emitted from the phosphors 32. The lenses 511*a* and 511*b* are each formed of a convex lens.

The lens arrays 512 and 513 homogenize the luminance distribution of the light having exited out of the collimation system 511. The lens array 512 includes a plurality of lenses 512*a*. The lens array 513 includes a plurality of lenses 513*a*. The lenses 512*a* correspond to the lenses 513*a* in a one-to-one relationship. The light having exited out of the collimation system 511 is incident on the plurality of lenses 512*a* in the form of spatially separate light fluxes. The lenses 512*a* bring the light fluxes incident thereon into focus at the corresponding lenses 513*a*. Secondary light source images are thus formed on the plurality of lenses 513*a*. The lenses 512*a* and 513*a* each have an outer shape substantially similar to the outer shape of an image formation region of each of the liquid crystal light valves 530R, 530G, and 530B.

The polarization converter 514 aligns the polarization states of the light fluxes having exited out of the lens arrays 512 and 513 with one another. The polarization converter 514 causes the light fluxes incident thereon to exit, for example, in the form of P-polarized light.

The superimposing lens 515 superimposes the light fluxes having exited out of the polarization converter 514 with one another in an illumination receiving region. The light having exited out of the superimposing lens 515 is spatially divided into a plurality of light fluxes, which are then superimposed on one another so that the luminance distribution of the light is homogenized.

The color separation system 520 includes dichroic mirrors 521 and 522, mirrors 523, 524, 525, and 526, relay lenses 527 and 528, and field lenses 529R, 529G, and 529B. The dichroic mirrors 521 and 522 are each, for example, a dielectric multilayer film laminated on a surface of a glass plate. The dichroic mirrors 521 and 522 are characterized in that they each selectively reflect color light that belongs to a predetermined wavelength band and transmit color light that belongs to the other wavelength band. The dichroic mirrors 521 and 522 reflect green light in the description.

The light having exited out of the superimposing lens 515 is yellow light Y and incident on the dichroic mirror 521. Red light R out of the yellow light Y passes through the dichroic mirror 521, is incident on the mirror 523, is reflected off the mirror 523, and is incident on the field lens 529R. The red light R is parallelized by the field lens 529R and then incident on the liquid crystal light valve 530R.

Green light G out of the yellow light Y is reflected off the dichroic mirror 521, then further reflected off the dichroic mirror 522, and incident on the field lens 529G. The green light G is parallelized by the filed lens 529G and then incident on the liquid crystal light valve 530G.

Blue light B having passed through the optical element 14 is reflected off the mirror 524, then passes through the dichroic mirrors 521 and 522 and the relay lens 527, is reflected off the mirror 525, further passes through the relay lens 528, is reflected off the mirror 526, and is incident on the filed lens 529B. The blue light B is parallelized by the filed lens 529B and then incident on the liquid crystal light valve 530B.

The liquid crystal light valves 530R, 530G, and 530B are each formed, for example, of a light modulator, such as a transmissive liquid crystal light valve. The liquid crystal light valves 530R, 530G, and 530B are electrically coupled to a signal source (not shown) that supplies image signals each containing image information, such as a PC. The liquid crystal light valves 530R, 530G, and 530B modulate the light incident thereon on a pixel basis based on the supplied image signals to form images. The liquid crystal light valves 530R, 530G, and 530B form a red image, a green image, and a blue image, respectively. The light fluxes modulated (images formed) by the liquid crystal valves 530R, 530G, and 530B enter the light combiner 540.

The light combiner 540 is formed, for example, of a dichroic prism. The dichroic prism has a structure in which four triangular prisms are bonded to each other. Surfaces of the triangular prisms that are the surfaces along which the prisms are bonded to each other form internal surfaces of the dichroic prism. A mirror surface that reflects the red light and transmits the green light and a mirror surface that reflects the blue light and transmits the green light are so formed on the inner surfaces of the dichroic mirror as to be perpendicular to each other. The green light that enters the dichroic prism passes through the mirror surfaces and directly exits out of the dichroic prism. The red light and the blue light that enter the dichroic prism are selectively reflected off the mirror surfaces or pass therethrough and exit in the same direction as the direction in which the green light exits. The three color light fluxes (images) are thus superimposed on and combined with one another, and the combined color light is enlarged by the projection system 550, which projects the enlarged color light on the screen 560.

The projector 500 includes the light emitting apparatus 40, which allows improvement in light emission efficiency. The projector 500 can therefore emit light having high luminance.

In the projector 500, the optical element 14 is a half-silvered mirror. The projector 500 can therefore emit the red light, the green light, and the blue light without use of a plurality of light source modules 510, whereby the size of the projector 500 can be reduced.

In the example described above, transmissive liquid crystal light valves have been used as the light modulators. Instead, light valves using no liquid crystal material or reflective light valves may be used. Examples of the light valves other than transmissive liquid crystal light valves may include reflective liquid crystal light valves and digital micromirror devices. The configuration of the projection system is changed as appropriate in accordance with the type of light valves to be used.

5.2. Variations of Projector 5.2.1. First Variation

A projector according to a first variation of the fifth embodiment will next be described with reference to the drawings. FIG. 21 diagrammatically shows a projector 600 according to the first variation of the fifth embodiment.

In the projector 600 according to the first variation of the fifth embodiment in the following description, a member having the same function as that of a constituent member of the projector 500 described above has the same reference character and will not be described in detail.

The projector 500 described above includes the light emitting apparatus 400, as shown in FIG. 20. In contrast, the projector 600 includes the light emitting apparatus 410, as shown in FIG. 21. A projector according to the disclosure does not necessarily include the light emitting apparatus 400 or 410 and can include any of the light emitting apparatuses according to the disclosure.

The projector 600 can provide the same effects as those provided by the projector 500 described above.

The projector 600, which includes the light emitting apparatus 410, can avoid the situation in which the same region of the columnar sections 30 is irradiated with the light emitted from the light source 10 so that the region is melted.

5.2.2. Second Variation

A projector according to a second variation of the fifth embodiment will next be described with reference to the drawings. FIG. 22 diagrammatically shows a projector 700 according to the second variation of the fifth embodiment.

In the projector 700 according to the second variation of the fifth embodiment in the following description, a member having the same function as that of constituent members of the projectors 500 and 600 described above has the same reference character and will not be described in detail.

In the projector 500 described above, the optical element 14 is a half-silvered mirror, as shown in FIG. 20. In contrast, in the projector 700, the optical element 14 is a mirror and does not transmit the light emitted from the light emitting devices 12, as shown in FIG. 22.

The projector 700 includes a light source module 710. The light source module 710 includes the light emitting devices 12, the light collection system 16, the lens arrays 512 and 513, the polarization converter 514, and the superimposing lens 515. The light source module 710 emits the blue light B. The blue light B emitted from the light source module 710 passes through the field lens 529B and is incident on the liquid crystal light valve 530B.

In the projector 700, the light source module 510 includes the light emitting apparatus 410. The color separation system 520 includes no dichroic mirror 522, the mirror 524, 525, or 526, or the relay lens 527 or 528 but includes a mirror 722, which reflects the green light G.

The projector 700 can provide the same effects as those provided by the projector 500 described above.

5.2.3. Third Variation

A projector according to a third variation of the fifth embodiment will next be described with reference to the drawings. FIG. 23 diagrammatically shows a projector 800 according to the third variation of the fifth embodiment.

In the projector 800 according to the third variation of the fifth embodiment in the following description, a member having the same function as that of constituent members of the projectors 500, 600, and 700 described above has the same reference character and will not be described in detail.

The projector 500 described above includes the light emitting apparatus 400, as shown in FIG. 20. In contrast, the projector 800 includes the light emitting apparatus 420, as shown in FIG. 23.

The light emitting apparatus 420 can emit collimated (substantially collimated) laser light. The light source module 510 of the projector 800 therefore needs to include no collimation system 511, unlike the light source module 510 of the projector 500 shown in FIG. 20. The light source module 510 of the projector 800 includes a diffusing lens 811, which diffuses the light emitted from the light emitting apparatus 420.

In the projector 800, the optical element 14 is a mirror, and the light source module 710 is provided. The color separation system 520 includes no dichroic mirror 522, the mirror 524, 525, or 526, or the relay lens 527 or 528 but includes the mirror 722, which reflects the green light G.

The projector 800 can provide the same effects as those provided by the projector 500 described above.

The projector 800 includes the light emitting apparatus 420 capable of emitting laser light. The projector 800 therefore needs to include no collimation system 511, unlike the projector 500 described above. The projector 800 therefore allows an increase in the distance between the light emitting apparatus 420 and a member on which the light having been just emitted from the light emitting apparatus 420 is incident (diffusing lens 811 in the example shown in FIG. 23). The projector 800 therefore allows, for example, a decrease in the distance between the light emitting apparatus 420 and the optical element 14, whereby the light emitting apparatus 420 can readily emit the light obliquely with respect to the first surface 22 of the base 20.

In the disclosure, part of the configurations may be omitted to the extent that the features and effects described in the present application are provided, and the embodiments and the variations may be combined with each other.

The present disclosure encompasses substantially the same configuration as the configuration described in each of the embodiments (for example, a configuration having the same function, using the same method, and providing the same result or a configuration having the same purpose and providing the same effect). Further, the present disclosure encompasses a configuration in which an inessential portion of the configuration described in each of the embodiments is replaced. Moreover, the present disclosure encompasses a configuration that provides the same working effects as those provided by the configuration described in each of the embodiments or a configuration that can achieve the same purpose as that achieved by the configuration described in each of the embodiments. Further, the present disclosure encompasses a configuration in which a known technology is added to the configuration described in each of the embodiments.

What is claimed is:

1. A light emitting apparatus comprising:
    a base;
    a light source that radiates light, the light from the light source having an optical axis; and
    a plurality of columnar sections that are provided at the base, the columnar sections each including a first phosphor that emits light when irradiated with light emitted from the light source,
    wherein the light from the light source radiates the columnar sections obliquely with respect to a columnar direction of the columnar sections,
    the optical axis of the light from the light source to the columnar section intersects the columnar direction,
    the columnar sections each include a first semiconductor layer and a second semiconductor layer so provided as to sandwich the first phosphor,
    the first semiconductor layer and second semiconductor layer each have a bandgap greater than energy of the light emitted by the first phosphor, and
    the first phosphor, the first semiconductor layer, and the second semiconductor layer are juxtaposed with each other along the columnar direction.

2. The light emitting apparatus according to claim 1, wherein the columnar sections each include
    a second phosphor that emits light when irradiated with the light radiated from the light source, and
    a third semiconductor layer having a bandgap greater than energy of the light emitted by the second phosphor,
    the second and third semiconductor layers are so provided as to sandwich the second phosphor,
    the second semiconductor layer has a bandgap greater than the energy of the light emitted by the second phosphor, and
    the first phosphor, the second phosphor, the first semiconductor layer, the second semiconductor layer, and the third semiconductor layer are juxtaposed with each other along the columnar direction.

3. The light emitting apparatus according to claim 1, wherein a first surface of the base has a protruding/recessed shape,
    first columnar sections out of the plurality of columnar sections are provided at first protruding sections that form the protruding/recessed shape of the first surface, and
    second columnar sections out of the plurality of columnar sections are provided at first recessed sections that form the protruding/recessed shape of the first surface.

4. The light emitting apparatus according to claim 3,
    third columnar sections out of the plurality of columnar sections are provided at second protruding sections that form the protruding/recessed shape of the first surface,
    fourth columnar sections out of the plurality of columnar sections are provided at second recessed sections that form the protruding/recessed shape of the first surface,
    when viewed along the columnar direction,
    the second columnar sections are so provided as to be shifted from the first columnar sections in a first direction,
    the fourth columnar sections are so provided as to be shifted from the first columnar sections in a second direction that intersects the first direction,
    the third columnar sections are so provided as to be shifted from the second columnar sections in the second direction and shifted from the fourth columnar sections in the first direction, and
    a distance between a center of each of the first columnar sections and a center of the second columnar section adjacent to the first columnar section, a distance between the center of each of the first columnar sections and a center of the fourth columnar section adjacent to the first columnar section, a distance between the center of each of the second columnar sections and a center of the third columnar section adjacent to the second columnar section, and a distance between the center of each of the third columnar sections and the center of the fourth columnar section adjacent to the third columnar section are equal to one another.

5. The light emitting apparatus according to claim 1, comprising a driver that rotates the base around an axis extending in the columnar direction as an axis of rotation.

6. The light emitting apparatus according to claim 1, wherein the columnar sections each have a hexagonal shape in a plan view viewed in the columnar direction.

7. The light emitting apparatus according to claim 1, wherein the light source includes
    a light emitting device that emits light, and
    an optical element that deflects an optical axis of the light emitted from the light emitting device.

8. A projector comprising:
    a base;
    a light source that radiates light, the light from the light source having an optical axis;
    a plurality of columnar sections that are provided at the base, the columnar sections each including a phosphor that emits light when irradiated with light emitted from the light source; and
    a driver that rotates the base around an axis extending in a columnar direction of the columnar sections as an axis of rotation,
    wherein the light from the light source radiates the columnar sections obliquely with respect to the columnar direction, and
    the optical axis of the light from the light source to the columnar sections intersects the columnar direction.

9. A light emitting apparatus comprising:
    a base;
    a light source that radiates light, the light from the light source having an optical axis;
    a plurality of columnar sections that are provided at the base, the columnar sections each including a first phosphor that emits light when irradiated with the light from the light source; and
    a driver that rotates the base around an axis extending in a columnar direction of the columnar sections as an axis of rotation,
    wherein the light from the light source radiates the columnar sections obliquely with respect to the columnar direction, and
    the optical axis of the light from the light source to the columnar section intersects the columnar direction.

10. A projector comprising:
    a base;
    a light source that radiates light, the light from the light source having an optical axis; and
    a plurality of columnar sections that are provided at the base, the columnar sections each including a phosphor that emits light when irradiated with light from the light source, wherein the light from the light source radiates the columnar sections obliquely with respect to a columnar direction of the columnar sections, the optical axis of the light from the light source to the columnar section intersects the columnar direction, the columnar sections each include a first semiconductor layer and a second semiconductor layer so provided as to sandwich the first phosphor, the first semiconductor layer and second semiconductor layer each have a bandgap greater than energy of the light emitted by the first phosphor, and the first phosphor, the first semiconductor layer, and the second semiconductor layer are juxtaposed with each other along the columnar direction.

11. A light emitting apparatus comprising:
a base;
a light source; and
a plurality of columnar sections that are provided at the base, the columnar sections each including a first phosphor that emits light when irradiated with light emitted from the light source and a first semiconductor layer provided between the first phosphor and the base, wherein the light source radiates the light to the columnar sections obliquely with respect to a columnar direction of the columnar sections, an optical axis of the light radiated from the light source to the columnar section intersects the columnar direction, the first semiconductor layer protrudes from the base along the columnar direction, the first phosphor and the first semiconductor layer are juxtaposed with each other along the columnar direction, and the first semiconductor layer has a bandgap greater than a bandgap of the first phosphor.

* * * * *